US007342804B2

(12) United States Patent
Langhorn et al.

(10) Patent No.: US 7,342,804 B2
(45) Date of Patent: Mar. 11, 2008

(54) BALL GRID ARRAY RESISTOR CAPACITOR NETWORK

(75) Inventors: Jason Langhorn, South Bend, IN (US); Craig Ernsberger, Granger, IN (US)

(73) Assignee: CTS Corporation, Elkhart, IN (US)

( * ) Notice: Subject to any disclaimer, the term of this patent is extended or adjusted under 35 U.S.C. 154(b) by 346 days.

(21) Appl. No.: 10/914,739

(22) Filed: Aug. 9, 2004

(65) Prior Publication Data

US 2006/0028288 A1 Feb. 9, 2006

(51) Int. Cl.
*H05K 1/16* (2006.01)

(52) U.S. Cl. ...................... 361/766; 361/765; 361/792; 361/794

(58) Field of Classification Search ........ 361/765–766, 361/792–794; 333/170–172
See application file for complete search history.

(56) References Cited

U.S. PATENT DOCUMENTS

| | | | | |
|---|---|---|---|---|
| 3,647,533 | A | | 3/1972 | Hicks |
| 3,849,757 | A | | 11/1974 | Khammous |
| 4,374,159 | A | * | 2/1983 | Pitetti et al. .................. 216/6 |
| 4,410,867 | A | * | 10/1983 | Arcidiacono et al. ....... 333/172 |
| 4,460,938 | A | * | 7/1984 | Clei .......................... 361/779 |
| 4,655,965 | A | | 4/1987 | Kuo |
| 5,220,489 | A | | 6/1993 | Barreto |
| 5,243,320 | A | | 9/1993 | Clouser |
| 5,367,284 | A | | 11/1994 | Morris |
| 5,485,138 | A | | 1/1996 | Morris |
| 5,586,006 | A | | 12/1996 | Seyama |
| 5,729,438 | A | | 3/1998 | Pieper |
| 5,912,507 | A | | 6/1999 | Dunn |
| 5,929,510 | A | * | 7/1999 | Geller et al. ................ 257/635 |
| 5,945,905 | A | | 8/1999 | Mazzochette |
| 5,977,863 | A | | 11/1999 | Bloom |
| 6,005,777 | A | | 12/1999 | Bloom |

(Continued)

FOREIGN PATENT DOCUMENTS

JP 2-153589/90 A 6/1990

(Continued)

OTHER PUBLICATIONS

Ohmega Technologies, Inc. Sep. 12, 2002 www.ohmega.com.

(Continued)

*Primary Examiner*—Tuan T. Dinh
(74) *Attorney, Agent, or Firm*—Mark P. Bourgeois

(57) ABSTRACT

An R-C network formed on a substrate. The capacitor includes a metal member with anodized and unanodized layers. The unanodized layer functions as one of the capacitor's electrodes. The anodized layer functions as the capacitor's dielectric layer. The resistor is formed from material on the same side of the substrate as the capacitor. In some versions of the invention, the resistor is formed on top of a substrate dielectric layer. In these versions of the invention, a conductor both functions as one of the capacitor's electrodes and connects the resistor to the capacitor. In alternative versions of the invention, the resistor is formed from a film that disposed on the undersurface a metal foil. The foil functions as the resistor to capacitor conductor. Sections of the foil that are removed expose and define the resistor. Solder balls or other connectors on the substrate surface connect the network to another component.

12 Claims, 20 Drawing Sheets

U.S. PATENT DOCUMENTS

| | | | | |
|---|---|---|---|---|
| 6,097,277 | A | 8/2000 | Ginn | |
| 6,100,596 | A | 8/2000 | Daly | |
| 6,108,212 | A | 8/2000 | Lach | |
| 6,124,634 | A | 9/2000 | Akram | |
| 6,194,979 | B1 * | 2/2001 | Bloom et al. | 333/22 R |
| 6,246,312 | B1 | 6/2001 | Poole | |
| 6,281,090 | B1 | 8/2001 | Kukanskis | |
| 6,285,542 | B1 * | 9/2001 | Kennedy et al. | 361/328 |
| 6,317,023 | B1 | 11/2001 | Felten | |
| 6,326,677 | B1 | 12/2001 | Bloom | |
| 6,631,551 | B1 | 10/2003 | Bowles | |
| 2002/0050400 | A1 | 5/2002 | Kusner | |
| 2002/0075131 | A1 | 6/2002 | Coates | |
| 2002/0108778 | A1 | 8/2002 | Dishongh | |
| 2002/0118094 | A1 | 8/2002 | Kambara | |
| 2002/0179329 | A1 | 12/2002 | Fukuoka | |
| 2003/1054592 | | 8/2003 | Felten | |
| 2004/0037058 | A1 | 2/2004 | Ernsberger | |

FOREIGN PATENT DOCUMENTS

| | | |
|---|---|---|
| JP | 5048258 | 2/1993 |
| JP | 7297555 | 11/1995 |
| JP | 8264929 | 10/1996 |
| JP | 2001168491 A | 6/2001 |
| JP | 2003092460 A | 3/2003 |
| WO | WO97/30461 | 8/1997 |

OTHER PUBLICATIONS

Gould Electronics Inc.—TCR Copper Foil Sep. 12, 2002 WWW. gouldelectronics.com/tcr.num.

MacDermid Printed Cirduit Processing Technologies Sep. 12, 2002 www.macprintedcircuits.com/advanced/.

Gould Electronic Materials, TCR™, Thin Film Embedded Resistors, Mar. 2002.

Ohmega Technologies, Inc., Omega-Ply, www.omega.com/home.menu, Dec. 4, 2002.

Felten and Ferguson DuPont—i-Technologies, IMAPS, Denver, Apr. 29, 2000, and IPC, San Diego, Apr. 5, 2000, Ceramic Resistors and Capacitors Embedded in PWB.

Felten and Borland , Advanced Embedded Passives Technology Consortium, Ceramic Resistors and Capacitors Embedded in PWB's, Apr. 3, 2001.

William Borland, Printed Circuit Design, Aug. 2001, Designing for Embedded Passives.

Borland, Felten, DuPont i-Technologies, Thick film Ceramic Capacitors and Resistors inside Printed Circuit Boards, 34th International Symposium on Microelectronics Oct. 9-11, 2001.

Felten, Snogren, Zhou, Fall IPC Meeting, Oct. 11, 2001, Embedded Ceramic Resistors and Capacitors in PWB: Process and Performance.

Borland, Ferguson, CircuiTree Magazine, 2001, Embedded Passive Components in Printed Wiring Board, a Technology Review.

Zhou, Myers, Felten, IMAPS 2002 Conference, Sep. 4-6, 2002, Embedded Passives Technology for PCSs: Materials, Design and Process.

Felten, Electronic Circuits World Convention 9, Paper No.: IPC31, Advanced Embedded Passives Technologies—Putting Ceramic Components into Organic PWBs.

Borland, Felten, Ferguson, Jones and Lawrence, IMAPS Advanced Technology Workshop on Passive Integration, Jun. 19-21, 2002, Embedded Singulated Ceramic Passives in Printed Wiring Boards.

Borland, Felten, Integration of Ceramic passives in Printed Wiring Board Substrates, (undated).

Borland, Felten, Dellis, Ferguson, Majumdar, Jones, Lux, Traylor, Doyle, International Electronics Packaging Technical Conference and Exhibition, Jul. 6-11, 2003, InterPack 2003-35090, Ceramic Resistors AMD Capacitors Embedded in Organic Printed Wiring Boards.

American Radio Relay League, Surface Mount Technology, www.arrl.org/tis/info/surface.html, Jul. 7, 2004.

Felten, Borland, IPC Printed Circuit Expo, Apr. 2001, Embedded Ceramic Passives in PWB: Process Development.

Felten and Ferguson, IPC Printed Circuit Expo, Apr. 2000, Embedded Ceramic Resistors and Capacitors for PWB.

Richard K. Ulrich, Processing Integrated Capacitors, Integrated Passive Component Technology, 2003.

* cited by examiner

BALL GRID ARRAY RESISTOR CAPACITOR NETWORK

BACKGROUND

1. Field of the Invention

This invention relates generally to an R-C network, and more particularly, an R-C network that is fabricated on a single surface of a substrate. One version of the invention is a dissipating terminator used to match the characteristic impedance of a transmission line.

2. Description of the Related Art

Transmission lines are used in a diverse array of electronic equipment to accommodate transmission of electrical or electronic signals. These signals may have a diverse set of characteristics, which might, for example, include direct or alternating currents, analog or digitally encoded content, and modulation of any of a diverse variety of types. Regardless of the characteristics of the signal, an ideal transmission line will conduct the signal from source to destination without altering or distorting the signal. Distance is inconsequential to this ideal transmission line, other than delays that might be characteristic of the transmission medium and the distance to be traversed.

At low frequencies and with direct current transmissions, many transmission lines perform as though they are nearly ideal, even over very great distances. Unfortunately, as the frequency of the signal increases, or as the frequency of component signals that act as a composite increases, the characteristics of most common transmission lines decay and signal transmission progressively worsens. This is particularly true when signals reach the radio frequency range or when transmission lines become longer. One common phenomenon associated with high frequency, long distance transmission lines is a loss of the signal's high frequency components and the introduction of extraneously induced interfering high frequency signals. Another common phenomenon is echo or line resonance, where a signal is reflected from one end of the transmission line back to the other. This echo, in the case of analog voice signals, is commonly known as reverberation, which leads to the effect of one sounding like speech is emanating from within a barrel. The auditory reverberation within a barrel generates a sound similar to the sound after an electrical signal echoes within a transmission line. In the case of a digital pulse, the effect will lead to corrupted data, since additional pulses may be received that were not part of the original transmission, and reflected pulses may cancel subsequent pulses.

In a number of electrical and electronic fields, new circuitry is being developed that has ever increasing capability for higher frequencies. The benefits of these higher frequency components is realized in faster computer processing, in the case of data processing, or broader bandwidth transmissions which can carry more voice signals, more television and radio signals and other signals all over the same communications channel. However, as these communications channels utilize ever-increasing frequencies, the limitations of conventional transmission lines are accentuated. In the case of copper transmission lines, radiation from a signal conductor is dependent directly upon the transmission line length and relative proximity of adjacent signal conductors. So, for example, a long signal line adjacent to another long signal line causes trouble even at lower frequencies. The original telephone lines were twisted in a particular way to reduce signal coupling between separate telephone lines. This signal coupling was aptly referred to in the art by the phrase "cross-talk", since signals from one telephone conversation would cross the lines into a different telephone line, resulting in talking which crossed the wires improperly. Cross-talk, as aforementioned, is dependent in part upon the spacing between adjacent signal lines. One method of reducing cross-talk is to increase spacing between lines. Unfortunately, another objective in the field of electronics is reduction of the size of components and systems. Simply increasing the spacing often results in greater expense, and also slower overall systems operation speeds—defeating the benefits that were otherwise attained by operating at higher frequencies. Another disadvantage of increased spacing comes from signal radiation. When a copper transmission line is made longer, the conductor will radiate and receive more high frequency energy. So, it is desirable to keep transmission lines shorter, not longer as might otherwise be dictated by cross-talk factors.

To prevent echo within a transmission line, it is possible to terminate the line with a device which is referred to in the art as an energy dissipating terminator. The terminator must have an impedance which is designed to match the characteristic impedance of the transmission line as closely as possible over as many frequencies of interest as possible. Transmission lines generally have an impedance which is based upon the inductance of the conductor wire, capacitance with other signal lines and ground planes or grounding shields, and resistance intrinsic in the wire. With an appropriate transmission line, the sum of the individual impedance components is constant and described as the "characteristic impedance." To match the transmission line characteristic impedance over a wide frequency range, a terminator must also address each of the individual impedance components. The effect of inductance is to increase impedance with increasing frequency, while capacitance decreases impedance with increasing frequency. Intrinsic resistance is independent of frequency.

In the particular field of data processing, transmission lines typically take the form of busses, which are large numbers of parallel transmission lines along which data may be transmitted. For example, an eight bit data bus will contain at least eight signal transmission lines that interconnect various components within the data processing unit. The data bus is actually a transmission line having to accommodate, with today's processor speeds, frequencies which are in the upper radio frequency band approaching microwave frequencies. These high frequency busses are, in particular, very susceptible to inappropriate termination and transmission line echo.

Terminators used for these more specific applications such as the data processor bus serve several purposes. A first purpose is, of course, to reduce echoes on the bus by resistively dissipating any signals transmitted along the bus. This first purpose is found in essentially all terminator applications. A second purpose, more specific to data busses or other similar electronic circuitry, is to function as what is referred to in the art as a "pull-up" or "pull-down" resistor. The terminator resistor is frequently connected directly to either a positive power supply line or positive power supply plane, in which case the termination resistor is a "pull-up" resistor, or the resistor may be connected to either a negative or ground line or plane, in which case the resistor is referred to as a "pull-down" resistor. When no signal is present on the line, the voltage on the transmission line is determined by the connection of the termination resistor to either a power supply line or a ground or common line. Circuit designers can then work from this predetermined bus voltage to design faster, more power-efficient components and circuits.

The structures of ball grid array R-C terminators are disclosed in the Applicant's Assignee's U.S. Pat. Nos. 6,005,777 and 6,194,979, both of which are explicitly incorporated by reference herein. Generally speaking, each of these terminators includes a ceramic substrate such as a substrate formed from alumina oxide. Resistors formed from a film of conductive-yet resistive material are formed on one surface of the substrate. Capacitors are formed on the opposed surface of the substrate. Each capacitor consists of a first electrode, a dielectric layer and a second layer. The electrodes and dielectric layers applied to the substrate by screen printing processes. Typically, plural resistors and capacitors are formed on each terminator-forming substrate. Conductive vias that extend through the substrate and conductive traces that extend over the surfaces of the substrate connect the capacitors and resistors together to form the desired R-C network.

Solder balls are mechanically and electrically connected to the side of the substrate on which the capacitors are formed. If required by the circuit, the solder balls are connected to the second electrodes of the capacitors. Alternatively, the solder balls are connected to conductors that are connected to other components of the R-C circuit.

An advantage of the above-designed terminators is that the solder balls provide the electrical connection between the terminator and the circuit board conductors to which the terminator is mounted. This eliminates the effort and expense associated with having to precisely solder densely packed terminator leads to complementary densely packed contact pads on the printed circuit board. Another benefit of the above-designed terminators is that the solder balls are disposed within the area subtended by the terminator substrate. Consequently, the complementary contact pads on the circuit board to which this type of terminator is mounted are similarly located under the terminator itself. This reduces the amount of surface area one is required to allocate on a printed circuit board in order facilitate the installation of the terminator.

The above-designed terminators are useful in many applications. However, in these terminators, as in other terminators, the resistors dissipate the applied signals by converting them into heat. There is an increasing interest in using these terminators to dissipate relatively high powered signals. Consequently, the resistors forming a terminator would generate more heat. A concern has arisen that this heat would not, in turn, dissipate away from the resistors. If this occurs, the heat would cause the temperature of the resistors and other components forming the terminator to, over time, break down. If such breakdown occurs, the utility of the terminator could be partially, if not wholly, rendered useless.

Moreover, as discussed above, in order to connect the resistors and capacitors together in the above-described terminators, it is necessary to provide vias through the substrate. This involves forming holes in the substrate and filling the holes with conductive material, typically a metal. Having to perform these steps adds to the overall cost of providing the terminators.

SUMMARY

It is a feature of this invention to provide a resistor-capacitor (R-C) network that can relatively efficiently dissipate the heat generated by the resistors forming the network.

It is a feature of this invention to provide an R-C network that includes a substrate formed from a metal that has relatively good thermal conductivity characteristics. The resistors and capacitors forming the network are formed on the substrate.

It is a feature of this invention to provide an R-C network wherein the dielectric layers of the capacitors are formed from anodized metal. In some versions of the invention, the outer surface of the metal substrate is anodized to form the capacitor dielectric layers. In these versions of the invention, the substrate thus forms one set of the electrodes for the capacitors.

If is a feature of this invention to provide an R-C network wherein the resistors and capacitors forming the network are formed on single, common surface of the substrate and the solder balls are also mounted to this surface.

It is feature of this invention to provide an R-C network that can be efficiently and economically manufactured.

The invention further resides in one or a combination of plurality of the above features disclosed and claimed herein.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiments may readily be used as a basis for the designing of other structures, methods and systems for carrying out the several purposes of the present invention. It is important, therefore, that the claims are regarded as including such equivalent constructions since they do not depart from the spirit and scope of the present invention.

Figure 1A:
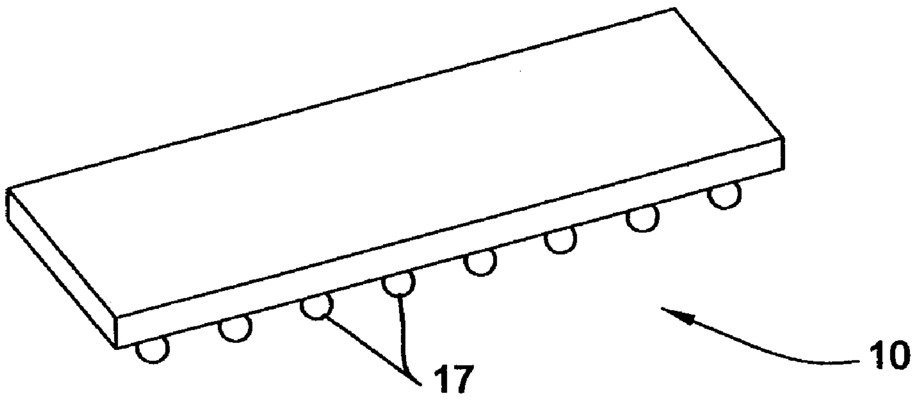
FIGS. 1A and 1B are perspective views of, respectively, the top and bottom of a terminator constructed in accordance with this invention.
Figure 1B:
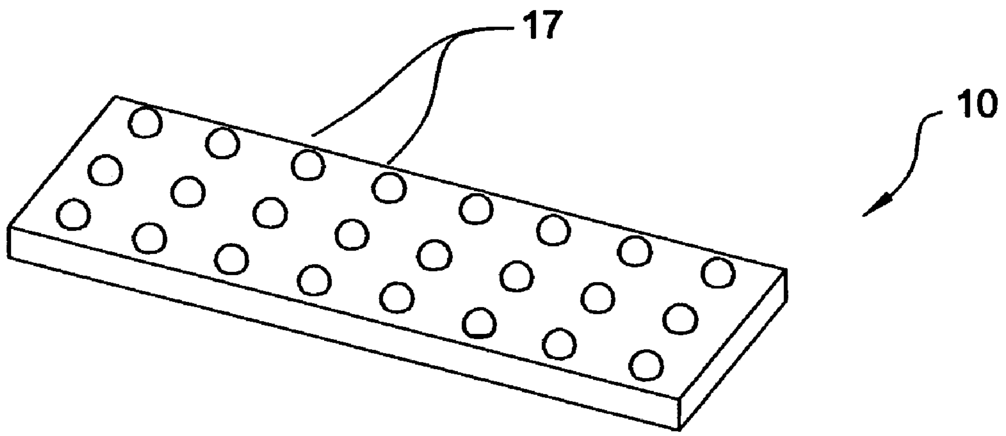

It is noted that the drawings of the invention are not to scale. The drawings are merely schematic representations, not intended to portray specific parameters of the invention.

The drawings are intended to depict only typical embodiments of the invention, and therefore should not be considered as limiting the scope of the invention. The invention will be described with additional specificity and detail through the accompanying drawings. The description of the invention may contain, for example, such descriptive terms as up, down, top, bottom, right or left. These terms are meant to provide a general orientation of the parts of the invention and are not meant to be limiting as to the scope of the invention.

DETAILED DESCRIPTION OF THE PREFERRED EMBODIMENTS

Referring to FIGS. 1A, 1B, 2 and 3, there is a ball grid terminator 10 of this invention. In particular, terminator 10 has a planar substrate 11 formed of a metal that is both thermally end electrically conductive. In the presently described version of the invention, substrate 11 is formed from aluminum. Substrate 11 has a top surface 12, an opposed bottom surface 13 and a thickness between the surfaces 12 and 13. Resistors 14 and capacitors 15 are disposed on the substrate bottom surface 13. Conductors 16 also disposed on the substrate bottom surface 13 electrically connect the resistors 14 and capacitors 15 together.

A plurality of solder balls 17 are mechanically connected to the substrate bottom surface 13. Solder balls 17 provide the conductive paths from the external contact pads to which the terminator 10 is mounted (contact pads not shown) to the components internal to the terminator. An electrically insulating and mechanically protecting covercoat 20 is disposed over the exposed surfaces of conductors 16 and is located between solder balls 17. While not illustrated, it should further be recognized that the covercoat may be applied around the side edges and top surface 12 of the substrate 11.

Figure 2:
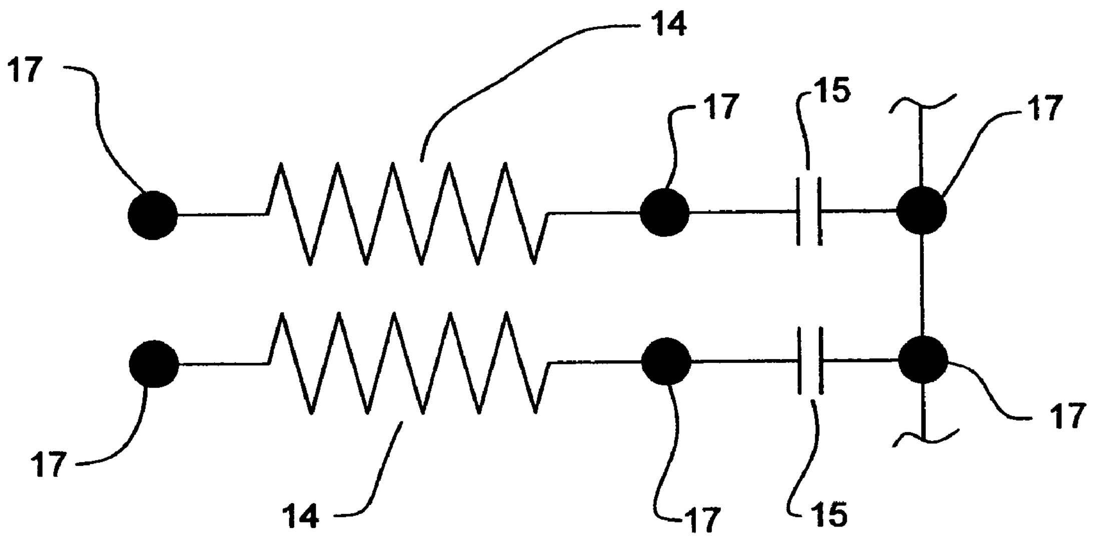
FIG. 2 is a schematic and diagrammatic view of a single R-C network internal to the terminator.

As seen by reference to FIG. 2, in the illustrated version of the invention, the terminator 10 is provided with a plurality of resistor 14—capacitor 15 pairs. Substrate 11 electrically connects the resistor 14—capacitor 15 pairs together. It should be understood that the disclosed circuit is exemplary and not limiting. Resistor-capacitor networks having configurations different from what is shown may be constructed according to this invention.

Figure 3:
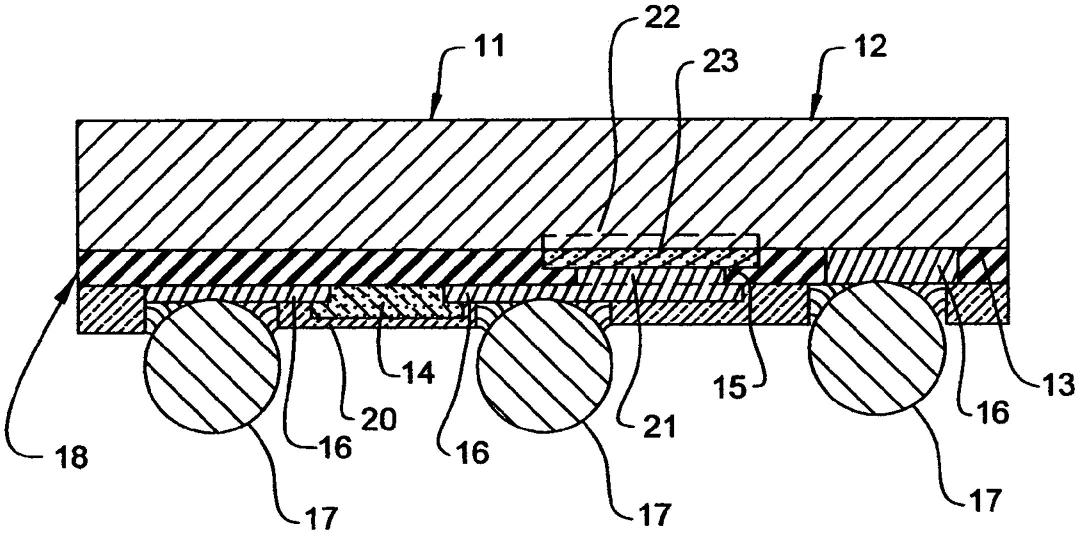
FIG. 3 is a cross-sectional view of the R-C network in its assembled state.

As will be described with respect to the process by which the R-C array of this invention is assembled, the resistors 14 are applied to the substrate by electroplating process. A first electrode of each capacitor 15, electrode 21, consists of a section of the material forming one of the conductors 16. In the version of the invention described with respect to FIG. 3, the second electrode of each capacitor, electrode 22, consists of section of the conductive metal forming the substrate 11. In FIG. 3, electrodes 21 and 22 are defined by dashed lines. These lines are shown only to identify the portion of the substrate 11 that forms electrode 22 and the portion of the conductor 16 that forms electrode 21, there is no actual physical difference or separation between the electrodes and the adjacent material from which they are formed.

The dielectric layer 23 between the first and second electrodes 21 and 22, respectively, of the capacitor 15 is a portion of the substrate 11 forming the bottom surface 13 that is anodized to be non-conductive. In FIG. 3, the dielectric layer 23 is defined by section of the same dashed lines that define electrodes 21 and 22.

Figure 4A:
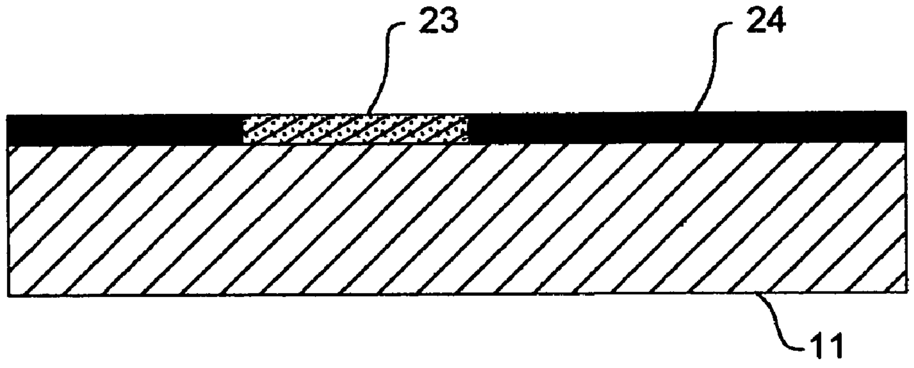
FIGS. 4A, 4B, 4C, 4D, 4E, 4F, 4G, 4H and 4I collectively illustrate the fabrication of the assembled R-C network of FIG. 3.
Figure 4B:
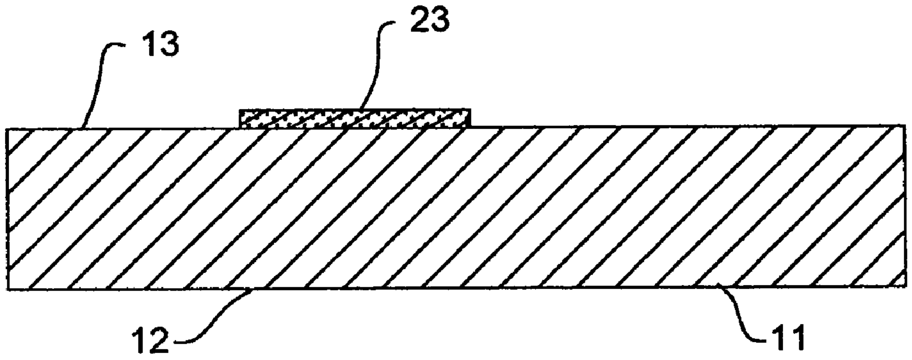

A process by which the terminator 10 of this invention is manufactured is now described by reference to FIGS. 4A-4I. Initially, as seen in FIG. 4A, a mask layer 24 is applied to the substrate bottom surface 13 so as to define the dielectric layers 23 for the capacitors 15. (FIGS. 4A-4I illustrate in cross-section how a single R-C pair is formed.) The portions of the substrate bottom surface 13 exposed through mask layer 24 are anodized to form the dielectric layers 23. Once the capacitor dielectric layers 23 are formed, mask layer 24 is stripped from the substrate 11 as seen by reference to FIG. 4B.

Figure 4C:
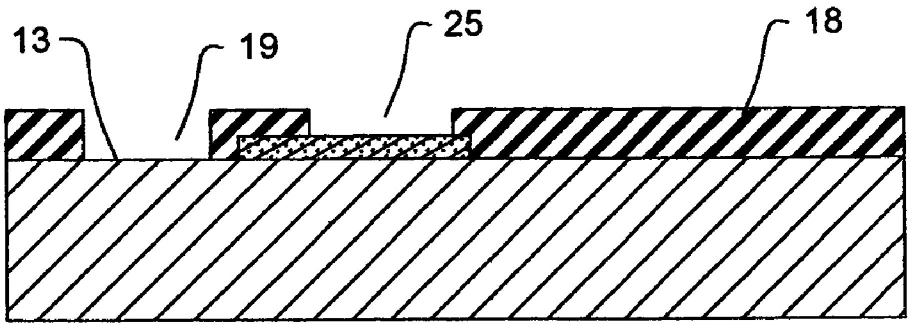

As represented by FIG. 4C, a layer of dielectric material, referred to assembly dielectric layer 18, is then applied over the exposed portions of the substrate bottom surface 13 and the capacitor dielectric layers 23 that are not otherwise to be electrically connected to other components of the terminator 10. Screen printing may be used to apply the assembly dielectric layer 18. Suitable material for forming the dielectric layer 18 that is also highly thermally conductive is commercially available from the Berguist Corporation of Chahassen, Minn. It will be noted that the material forming assembly dielectric layer 18 is applied to the assembly so as to define openings. A first opening 25 is immediately above the exposed surface of the capacitor dielectric layer 23. A second opening 19 exposes a portion of the substrate bottom surface 13.

Figure 4D:
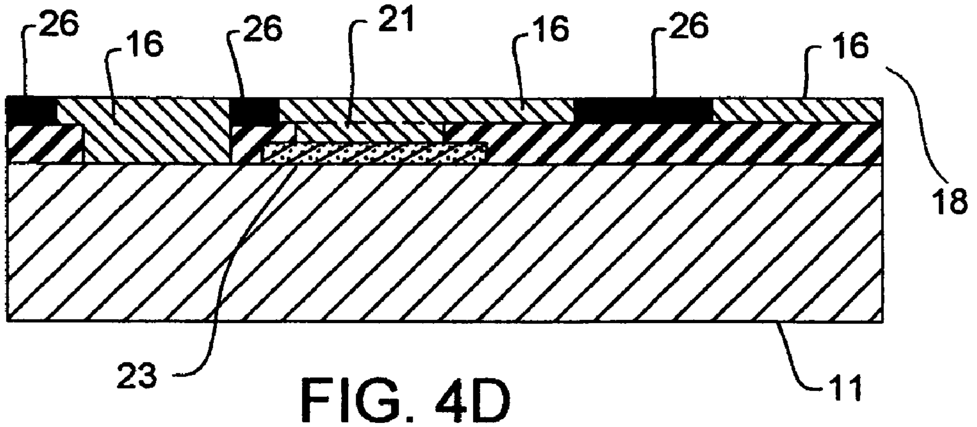

Once assembly dielectric layer 18 is applied, a layer of copper that forms conductors 16 is applied. More particularly, as depicted by FIG. 4D, prior to the actual application of the copper layer, a mask layer 26 is applied over the portions of the exposed surfaces of assembly dielectric layer 18 so as to cover the portions of the dielectric material over which the conductors 16 are not to extend. Once mask layer 26 is set, the copper is plated over the assembly dielectric layer 18 from the conductors 16. It is further seen that this copper plated into openings 19 and 25. The copper plated into opening 25 in addition to forming one of the conductors 16, also forms the capacitor first electrode 21.

Figure 4E:
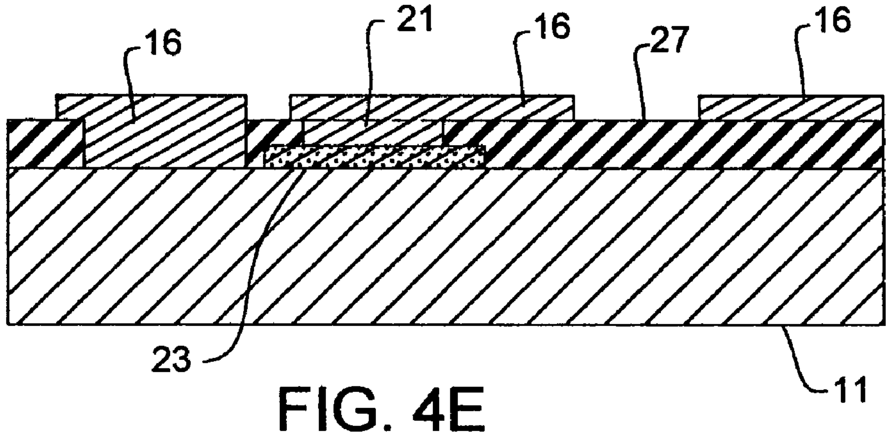

Referring to FIG. 4E, it can be seen that mask layer 26 is then stripped from the assembly. The stripping of mask layer 26 leaves an opening 27 above the assembly dielectric layer 18 that is defined by the conductors 16.

Figure 4F:
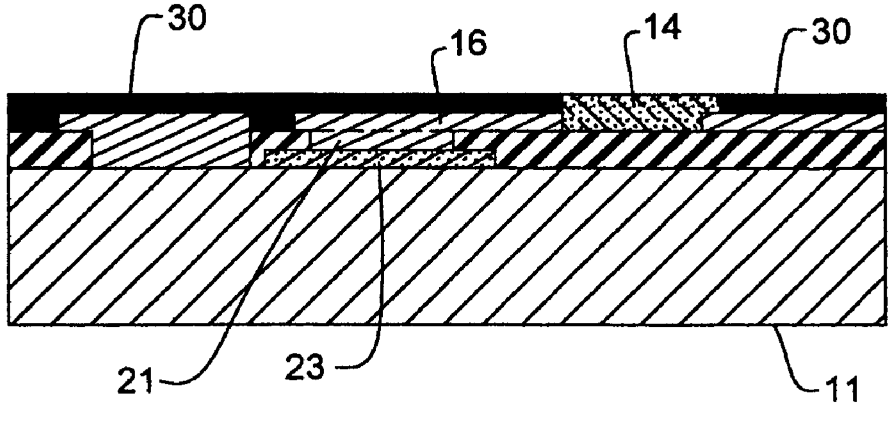

The resistor 14 is then applied to the assembly by electroplating as seen by reference to FIG. 4F. One such process for applying a resistor is commercially available from the MacDermid Corporation of Waterbury, Conn. Details of the design and manufacture of such resistors are disclosed in U.S. Pat. No. 6,281,090 the contents of which are herein explicitly incorporated by reference. Generally, it should be understood that in this process a mask layer 30 is applied to the exposed faces of the assembly dielectric layer 18 and the conductors 16 to which the material forming the resistor 14 is not to be applied. Thus, the mask layer 30 is essentially applied over the whole of the exposed face of the assembly except for the surfaces exposed by opening 27 and the perimeter surfaces of conductors 16 that define the opening. The resistive material forming resistor 14 is then applied to the assembly.

Figure 4G:
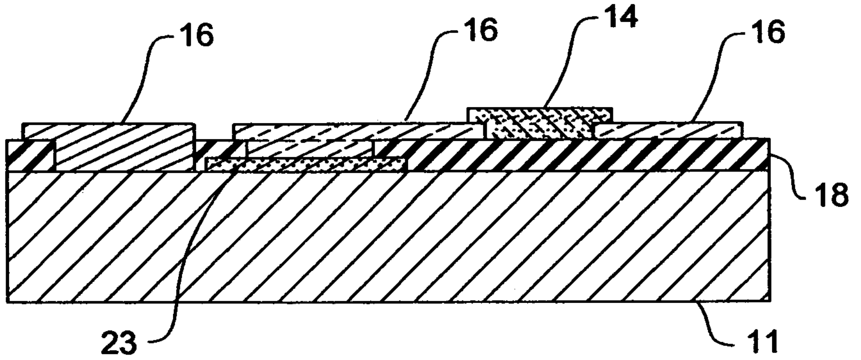

Mask layer 30 is then stripped from the assembly as represented by FIG. 4G. Once mask layer 30 is stripped, the material forming resistor 14 is laser trimmed in order to establish the desired resistance of resistor 14.

Figure 4H:
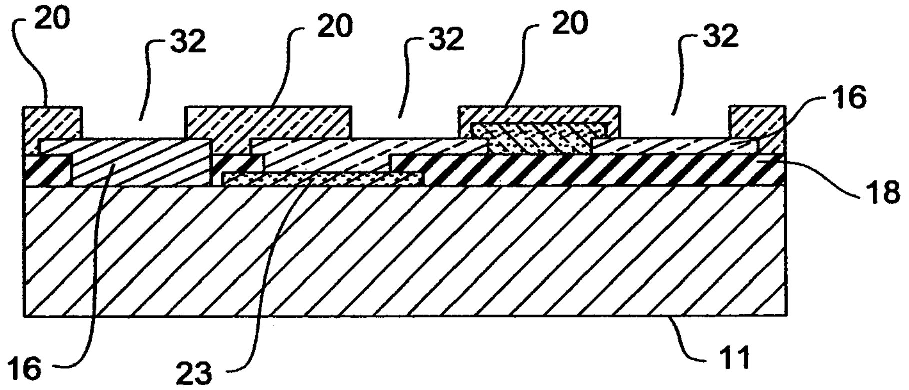
Figure 4I:
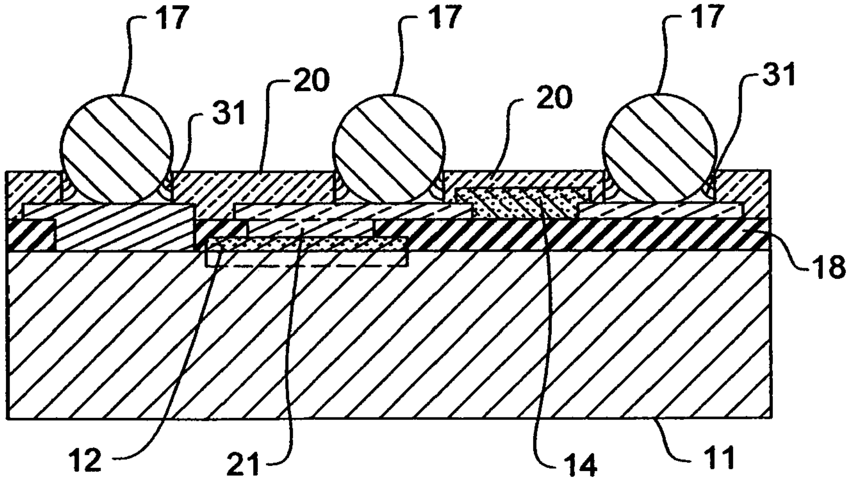

Covercoat 20 is then applied to the assembly as represented by FIG. 4H. The covercoat 20 is applied in a screen printing process to cover the exposed faces of resistor 15 and the assembly dielectric layer 25. The covercoat is further applied to the assembly to only cover portions of the exposed faces of conductors 16. Openings 32 defined by the cover coat leave portions of the faces of conductors 16 exposed.

Once covercoat 20 has cured solder balls 17 are electrically and mechanically connected to the partially assembled terminator 10. More particularly solder paste 31 is applied by conventional means into openings 32 so as to flow over the exposed faces of conductors 16. The solder balls 17 are mounted in the solder paste 31 so as to be electrically and mechanically connected to the conductors 16. Thus, in the depicted version of the invention, a first one of the solder balls 17 is connected to one of the conductors 16 that extends directly to the substrate 11. A second one of the solder balls 17 is connected to the conductor 16 that forms capacitor electrode 21. A third one of the solder balls 17 is connected to the conductor 16 connected to resistor 14.

Not shown, but understood to be part of the process of assembling terminator 10, is the application of a covercoat over the substrate top surface 12 and edge surfaces.

Terminator 10 of this invention has a substrate 11, which, being metal, has a greater thermal conductivity than a substrate formed from a ceramic material. Thus, the substrate, in addition to functioning as a support frame for the other components serves as a heat sink through which heat generated by the resistors 14 is dissipated. This escape path for the resistor heat thus serves to hold the temperature of the resistors 14 to a level below which the heat of these components could cause either their breakdown or the breakdown of the surrounding components.

It should be recognized that, in order to facilitate the transfer of heat away from the resistors 14, these components should be as close to substrate 11. Thus, in some preferred versions of the invention, the assembly dielectric layer 18, the material that separates the resistors 14 from the substrate 11, has a thickness of 0.006 inches or less. In more preferred versions of the invention, the assembly dielectric layer 18 has a thickness of 0.003 inches or less.

Still another feature of this embodiment of the invention is that an anodized section of the substrate 11 functions as the capacitor dielectric layer 23. The anodized capacitor dielectric layer 23 is much thinner than a conventional thin film dielectric. For example, in many versions of the invention, it is anticipated that capacitor dielectric layer 23 will have a thickness of 1.5 microns or less. In more preferred versions of the invention, layer 23 will have a thickness of 500 Angstroms or less. Thus, this feature of the invention makes it possible to fabricate capacitors having a relatively high capacitance and that are relatively thin. Still another advantage of this feature of the invention is that it provides a means to allow the substrate 11 to function as one of the electrodes for the capacitor 15.

It will be further observed that the terminator 10 of this invention is constructed so that the resistors 14 and capacitors 15 forming the R-C network and their associated conductors and the solder balls 17 are attached to a single one of the primary surfaces of the substrate, the bottom surface 13. Thus, since there are no components mounted on substrate top surface 12, when fabricating the terminator 10 of this invention there is no need to go the expense of providing vias through the substrate in order to connect components of the opposed sided of the substrate.

Figure 5:
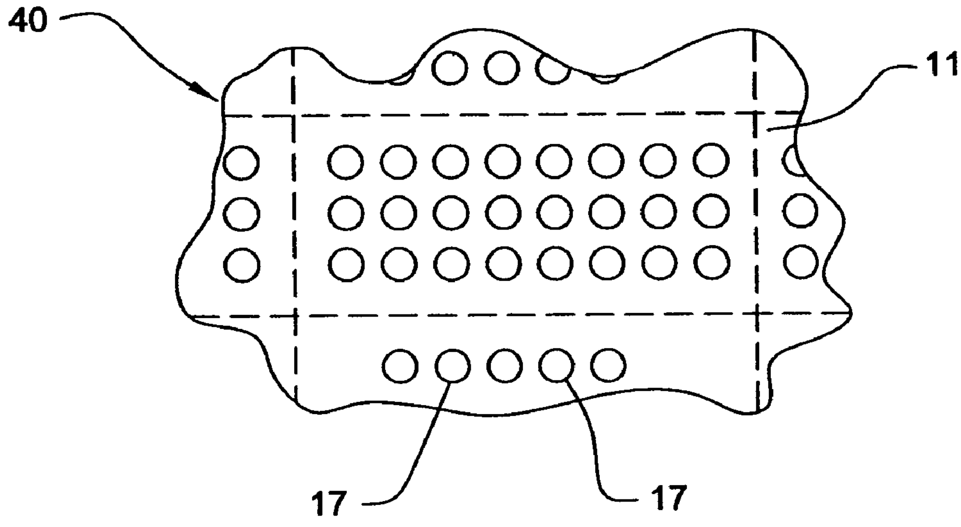
FIG. 5 is a diagrammatic view of a section of a large substrate that illustrates how the substrates of plural terminators are fabricated simultaneously.

Moreover, as represented by FIG. 5, it is anticipated that a number of different sets of R-C arrays, each of which is used to form a single terminator 10, will be simultaneously formed on a single large area substrate 40. After the R-C arrays are formed on the large area substrate 40, the substrate 40 is cut so as to form plural individual substrates 11. This mass production of the substrates 11 reduces the cost of their fabrication and of the terminators 10 into which the substrates 11 are assembled.

Figure 6:
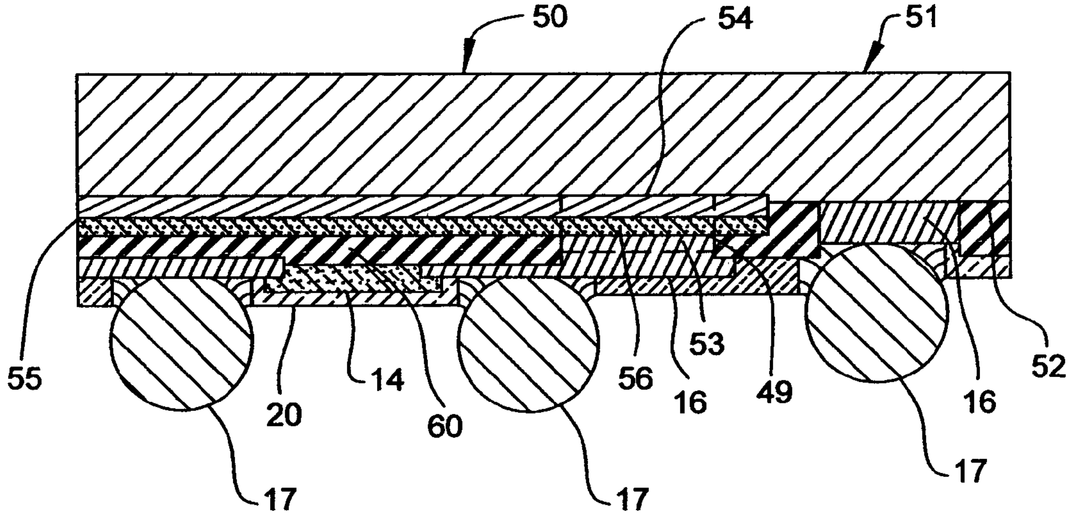
FIG. 6 is cross-sectional view of an alternative R-C network constructed in accordance with this invention.

FIG. 6 illustrates an alternative embodiment of this invention. It should be understood that components of this alternative embodiment identical to those in the first described embodiment are only minimally described and referenced by the same identification numbers.

This second embodiment of the invention includes a substrate 50 formed of copper. Substrate 50 has opposed top and bottom surfaces 51 and 52, respectively. A resistor 14, conductors 16 and a capacitor 49 are formed on the substrate bottom surface 52. Resistor 14 and conductors 16 are formed in the same generally way as described with respect to the first embodiment of the invention. In this version of the invention, capacitor 49 is formed so as to have a first electrode 53 that is formed from an end of an adjacent conductor 16. Capacitor 49 has a second electrode, electrode 54, that is formed from a section of the inner layer of a metal foil 55 disposed over a portion of the substrate bottom surface 52. An exposed outer anodized layer of the metal foil 55 forms the capacitor dielectric layer 56. In FIG. 6, dashed lines define the portions of the conductor 16, the conductive layer of the metal foil and the anodized layer of the metal foil that, respectively, define electrodes 53 and 54 and dielectric layer 56. This is solely to illustrate these components. There is no actual physical difference or separation between these components and the adjacent material from which they are formed.

Covercoat 20 extends over the exposed surfaces of the resistor 14 and conductors 16. Solder balls 17 provide the mechanical and electrical connections between the external components and the terminator conductors 16.

A means by which the alternative R-C network of this invention can be fabricated is now described by reference to FIGS. 7A-7J. Initially, as seen by reference to FIG. 7A, metal foil 55 is deposited over substantially the whole of the substrate bottom surface 52. This foil 55 is formed from a valve metal such as aluminum or tantalum.

Figure 7A:
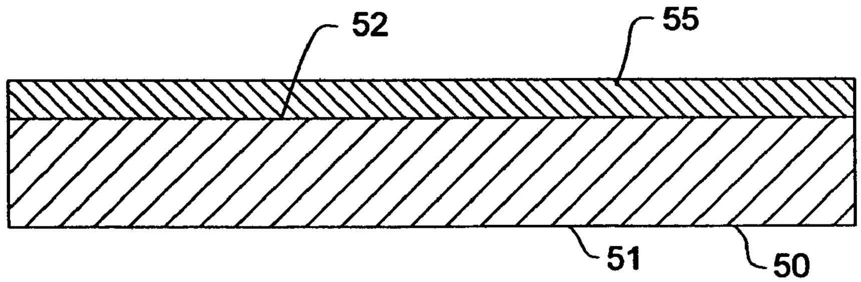
FIGS. 7A, 7B, 7C, 7D, 7E, 7F, 7G, 7H, 7I and 7J collectively and sequentially illustrate the fabrication of the assembled R-C network of FIG. 6.
Figure 7B:
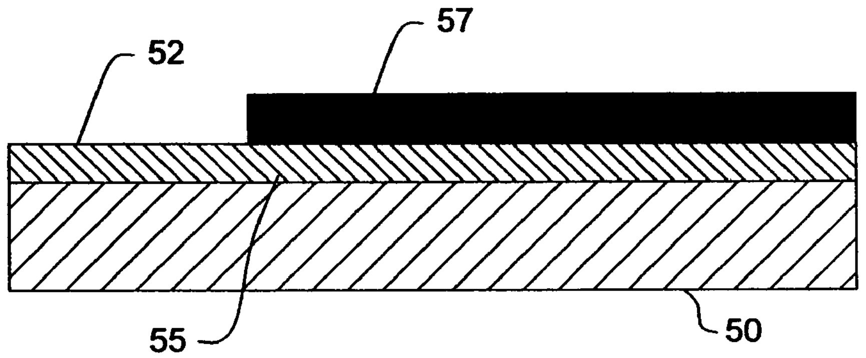
Figure 7C:
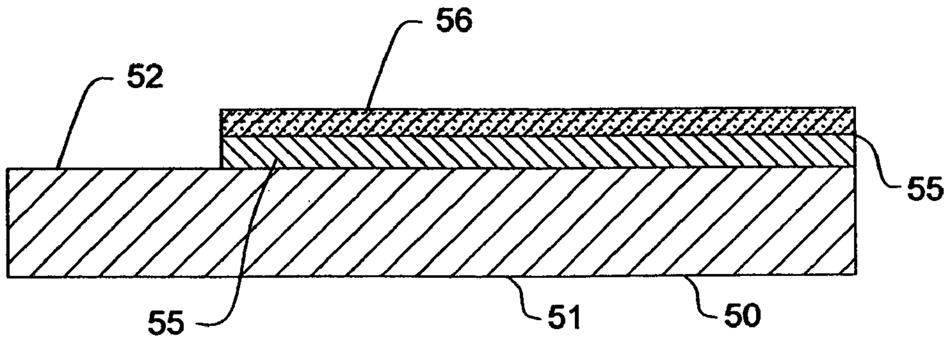

Once metal foil 55 is deposited over the substrate 50, a mask layer 57 is disposed over the portion of the foil to remain in place as is depicted in FIG. 7B. The foil to be removed is then stripped. Then, as represented by FIG. 7C, the outer exposed surface of the foil is anodized. This inner, conductive layer of the foil functions as the capacitor second electrode 54. The outer anodized layer of the foil 55 functions as the capacitor dielectric layer 56.

Figure 7D:
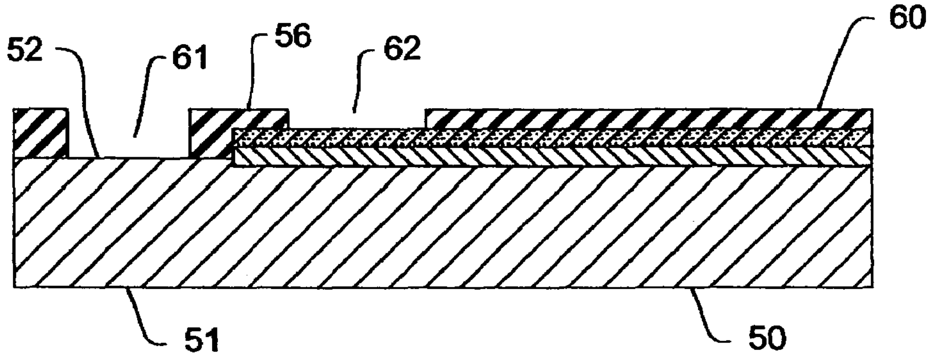

As represented by FIG. 7D, an assembly dielectric layer 60 is then selectively applied over the exposed portions of the substrate bottom surface 52 and the capacitor dielectric layer 56. As with assembly dielectric layer 24, screen printing may be used to apply assembly dielectric layer 60. It can be seen that the assembly dielectric layer 60 is applied to the assembly so as to define a first opening 61 that extends to an exposed portion of the substrate bottom surface 52 and a second opening 62 to the exposed face of the anodized metal foil that defines the capacitor dielectric layer 56.

Figure 7E:
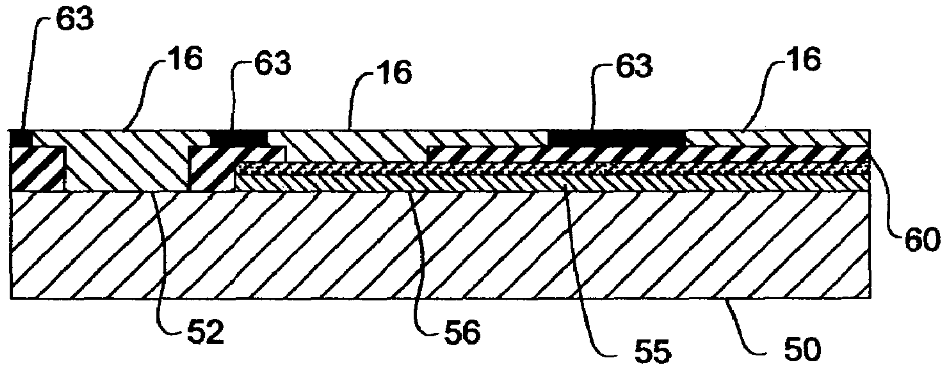
Figure 7F:
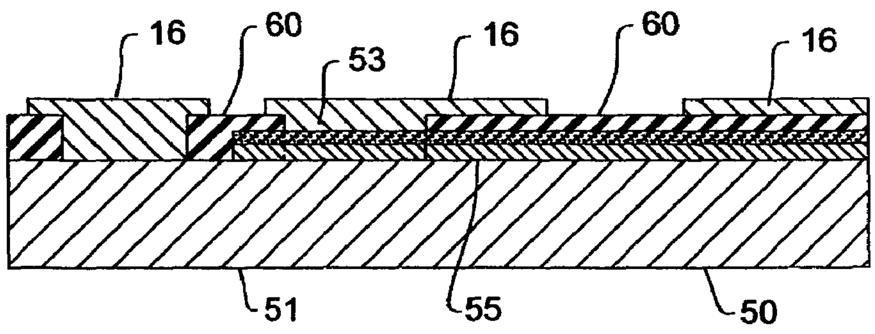

Copper forming conductors 16 is applied to the assembly in manner identical to that in which was applied in the first embodiment of the invention, (FIG. 7E). Here a mask layer 63 is applied to define gaps between the conductors. The copper establishes a conductor 16 that, in opening 61 extends to the substrate bottom surface. The copper also establishes, in opening 62, electrode 53 of the capacitor 49. The mask layer 63 used to define the gaps between the conductors 16 is then removed, (FIG. 7F).

Figure 7G:
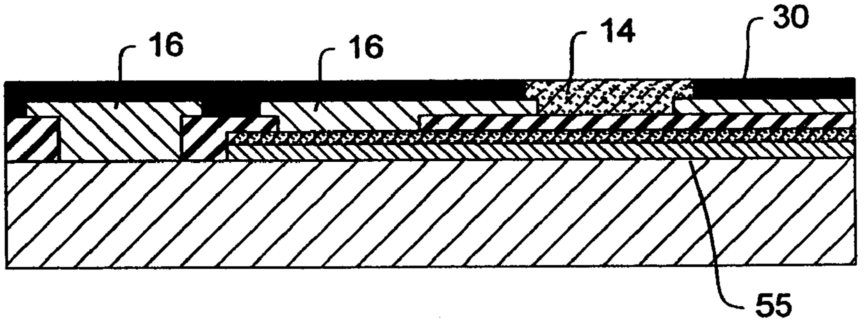
Figure 7H:
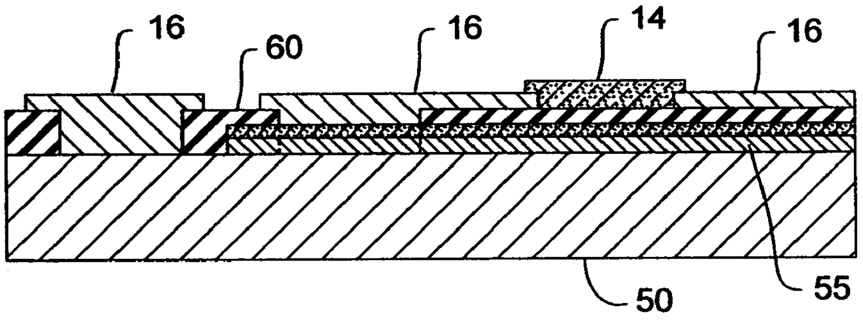

Resistor 14 is then formed between one of the gaps between conductors, (FIG. 7G). The mask layer 30 used to basically define the resistor 14 is stripped from the assembly, (FIG. 7H). The resistance of resistor 14 is then established by the selective laser trimming of the resistor 14.

Figure 7I:
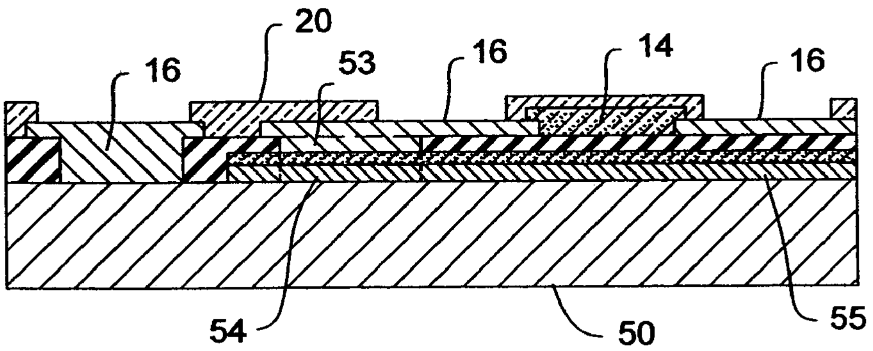
Figure 7J:
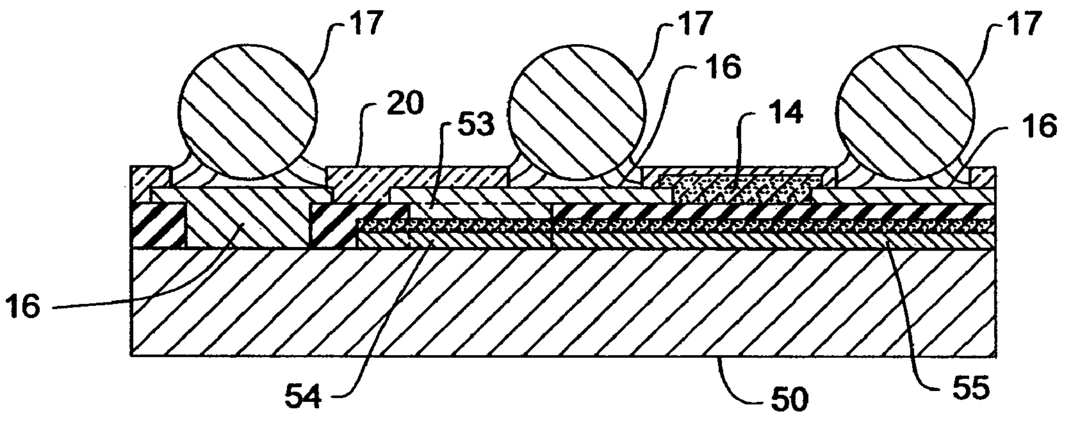

Covercoat 20 is then selectively applied over the exposed surfaces of the resistor 14, the conductors 16 and the assembly dielectric layer 60, (FIG. 7I). Solder balls 17 are then solder bound to the exposed faces of conductors 16, (FIG. 7J).

A feature of this version of the invention is that the section of the assembly dielectric layer 60 that separates the resistor 14 and the metal foil 55 has a relatively narrow thickness. Typically, the thickness of this layer is 0.006 inches or less. In more preferred versions of the invention this thickness is 0.003 inches or less. A benefit gained by having this section of the assembly dielectric layer 60 with such a narrow width is that it facilitates the conductive heat transfer away from the resistor 14 to the metal foil 55 and the substrate 50.

Figure 8:
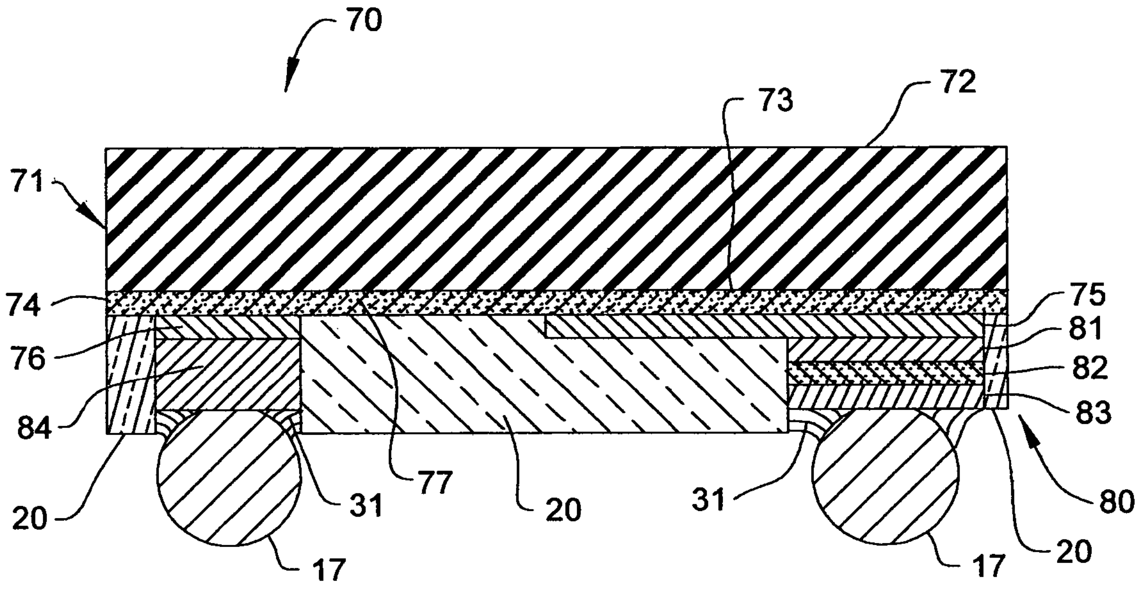
FIG. 8 is a cross-sectional view of a third alternative R-C network constructed in accordance with this invention.

A third preferred embodiment of this invention is now described with respect to FIG. 8. In this version of this embodiment of the invention, a terminator 70 has a non-conductive substrate 71. Often, this nonconductive substrate 71 is formed from a composite material. Examples of such materials are epoxy-glass, phenolic-paper, or polyester-glass; and typical composites used in circuit board manufacturing include polyimides for flexible circuitry or high-temperature applications; paper/phenolic which can be readily punched: National Electrical Manufacturers Association (NEMA) grade FR-2; paper/epoxy which has better mechanical properties than the paper/phenolic: NEMA grade FR-3; glass/epoxy and woven glass fabric which have good mechanical properties: NEMA grade FR-4, FR-5; and random glass/polyester which is suitable for some applications: NEMA grade FR-6. NEMA FR-4 material is preferred.

The glass/epoxy layers are bonded together using adhesive layers, which are conventionally called "prepreg" because they are partially cured before lamination. For a discussion of wiring board fabrication methods, including lamination techniques, see, Shaw, Sam R. and Alonzo S. Martinez Jr. "*Rigid And Flexible Printed Wiring Boards And Microvia Technology*" in Harper, Charles A., Ed. *Electronic Packaging And Interconnection Handbook,* 3rd Ed., Chapter 11, McGraw-Hill, New York, N.Y. (2000), the relevant portions of which are herein incorporated by reference.

Substrate 71 has opposed top and bottom surfaces 72 and 73, respectively, and a thickness between these major surfaces. A layer of resistive material 74 is at least partially disposed over substrate bottom surface 72. Spaced apart conductors 75 and 76 are disposed over the resistive material 74. Resistive material 74 thus forms a resistor, pointed by identification number 77 and an accompanying lead line, on the substrate bottom surface 73 in the area in which the conductors 75 and 76 do not overlie the resistive material.

A capacitor 80 is disposed over and connected to one of the conductors, here conductor 75. The capacitor 80 is partially formed from a segment of an anodizable metal member such as tantalum. Specifically, the metal member has unanodized inner layer 81 that is in contact with the exposed face of conductive trace 75. This metal member inner layer 81 functions as the inner electrode for the capacitor 80. Above and integral with inner layer 81, the metal member has an anodized outer layer 82. The metal member outer layer 82 functions as the capacitor dielectric layer.

Capacitor 80 also includes an outer electrode 83. The outer electrode 83 is formed from conductive material such as an electroplated layer of copper that is disposed over the exposed face of the metal member anodized outer layer 82.

Clearcoat 20 selectively covers the exposed faces of conductive trace 75 and resistor 77. A first solder ball 17 is bonded to the outer exposed face of the capacitor outer electrode 83. A copper trace 84 is disposed over conductor 76 to function as a ball pad. A second solder ball 17 is bonded to the exposed face of conductive trace 84.

One process by which the R-C network integral with terminator 70 is fabricated is now described by reference to FIGS. 9A-9J. Initially, the substrate 71 and a layer of foil material, referred to as the R-C foil 90, are provided as seen by reference to FIG. 9A. The primary substrate for the R-C foil 90 consists of a layer of copper foil 91. The resistive material 74 is disposed on the inner surface of the copper foil 91, (the surface to be bonded to the substrate 71). Processes for fabricating this structure are disclosed in the Applicant's U.S. patent application Ser. No. 10/309,704, entitled BALL GRID ARRAY RESISTOR NETWORK, filed Dec. 4, 2002, U.S. Pat. Pub. No. 2004/0108937 A1, now U.S. Pat. No. 6,897,761, and now wholly and explicitly incorporated herein by reference. A layer of tantalum 92 or other valve metal is disposed over the outer layer of copper foil 91.

Figure 9A:
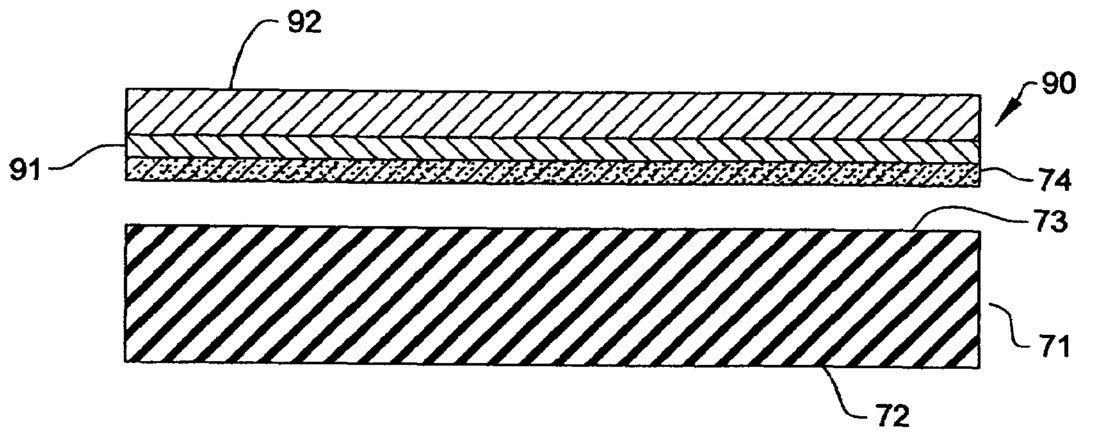
FIGS. 9A, 9B, 9C, 9D, 9E, 9F, 9G, 9H, 9I and 9J collectively illustrate the fabrication of the assembled R-C network of FIG. 8.
Figure 9B:
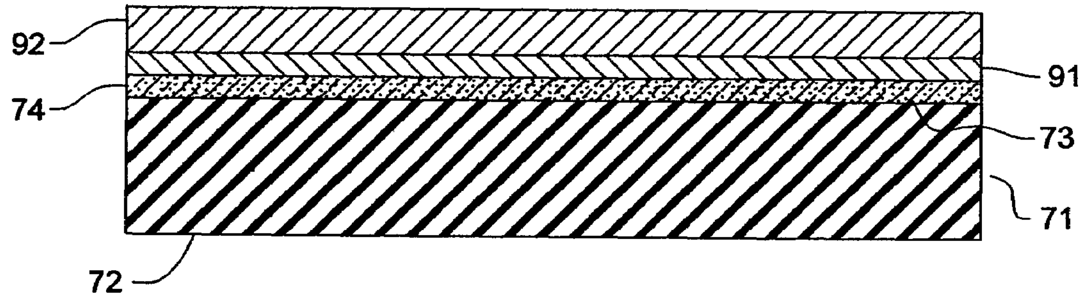

Once the substrate 71 and R-C foil 90 are provided, the foil 90 is laminated to the substrate bottom surface 73, represented by FIG. 9B.

Figure 9C:
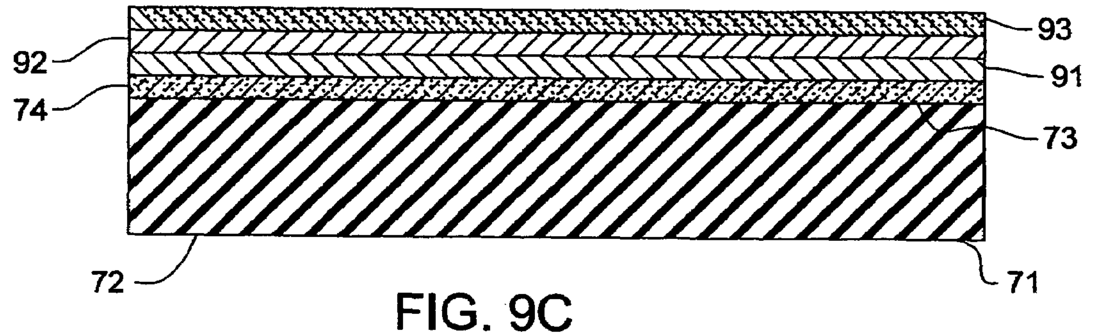
Figure 9D:
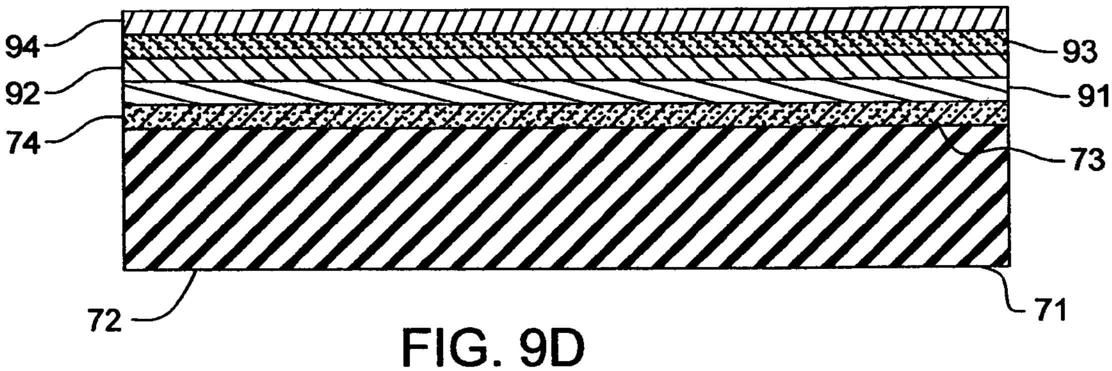

As represented by FIG. 9C, the outer exposed layer of the tantalum 92 is then anodized along the whole of its surface to form an outer anodized layer 93. Then, as illustrated by FIG. 9D, an electrode 94 is formed over the whole of the tantalum anodized layer 93. This electrode 94 may, for example be formed by electroplating.

Figure 9E:
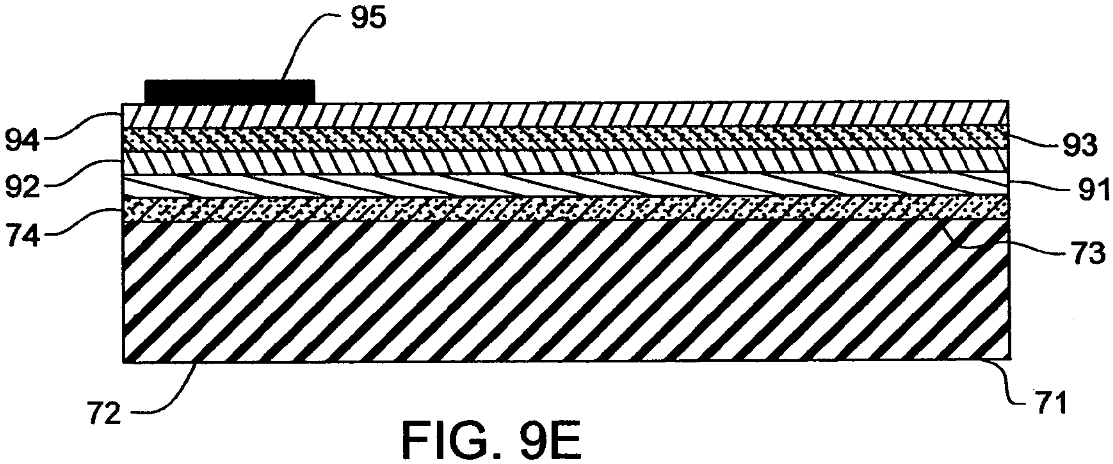
Figure 9F:
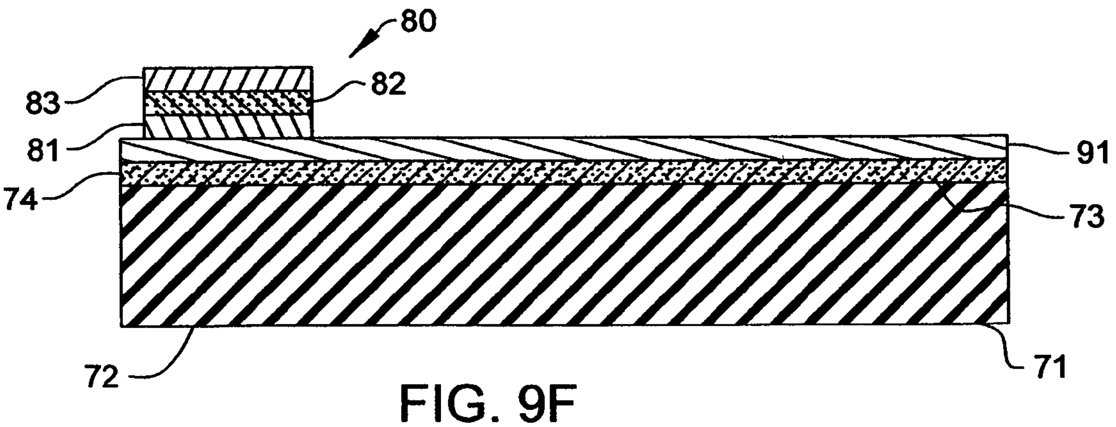

Once electrode 94 is formed, sections to the electrode 94, the tantalum anodized layer 93 and unanodized tantalum 92 are selectively removed so that the remaining sections define capacitor 80. Specifically, as depicted by FIG. 9E, a mask 95 is formed over the section of electrode 94 that is to function as capacitor outer electrode 83. The majority of electrode 94, the tantalum anodized layer 93 and unanodized tantalum 92 are then removed and mask 95 is stripped from the workpiece. As a result of the process, the capacitor 80, specifically, the unanodized tantalum inner electrode 81, the anodized tantalum dielectric layer 82 and the copper outer electrode 83 are formed as shown in FIG. 9F. (The step of stripping mask 95 and the steps of stripping the subsequent described masks are not illustrated.)

Figure 9G:
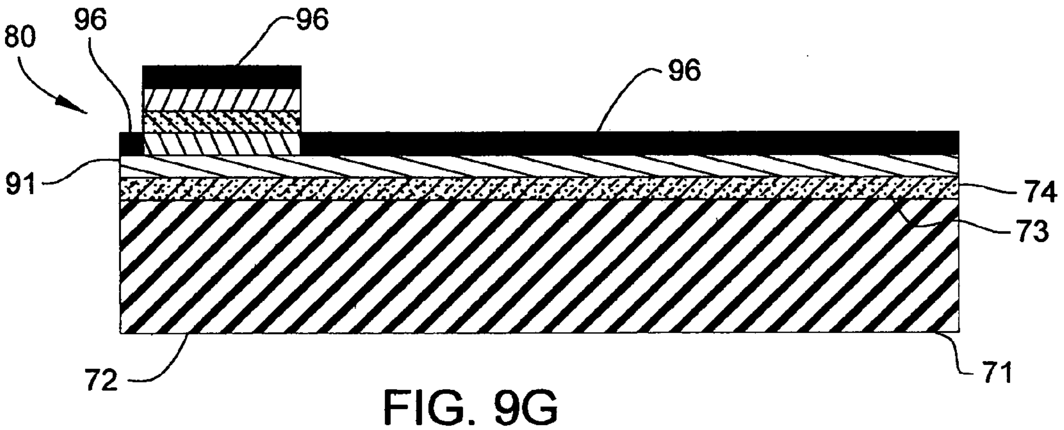
Figure 9H:
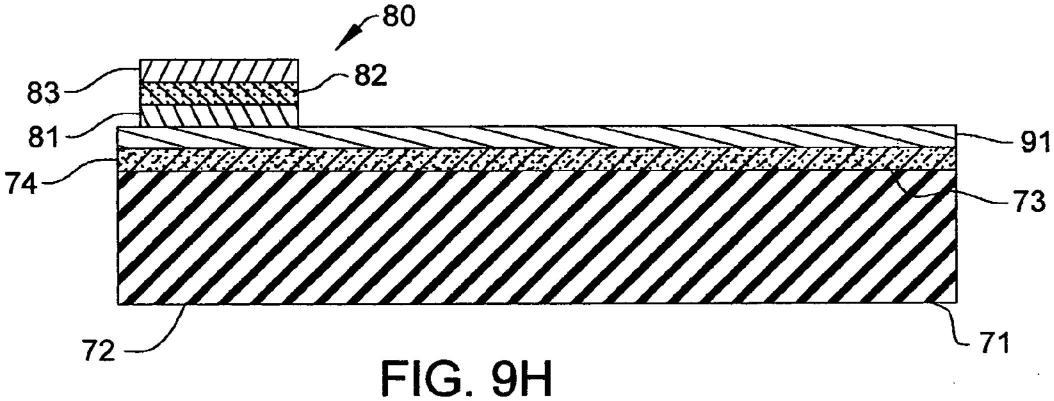

Once capacitor 80 is defined, portions of the workpiece are subjected to a second set of masking and etching processes. First, as represented by FIG. 9G, portions of the workpiece that will function as either a capacitor, a resistor or a conductive trace are coated with a mask 96. Unmasked portions of the workpiece are then etched away to the substrate bottom surface 73. Mask 96 is then stripped from the workpiece. Consequently, in some sections of the workpiece, layers such as those depicted in FIG. 9H are disposed over the substrate. In other sections of the workpiece, there is no material located above the substrate bottom surface 73, (view not shown). Thus, this masking, etching and stripping process is used to define above the substrate bottom surface 73 the interstitial gaps between the components on the substrate 71. These gaps are the gaps that separate and electrically insulate the conductive traces 75 and 76, resistors 77 and capacitors 80 from each other.

Figure 9I:
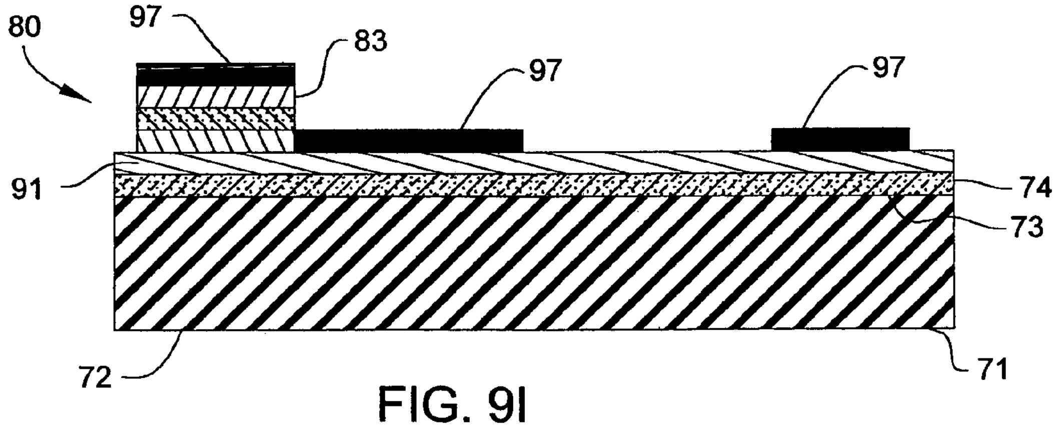
Figure 9J:
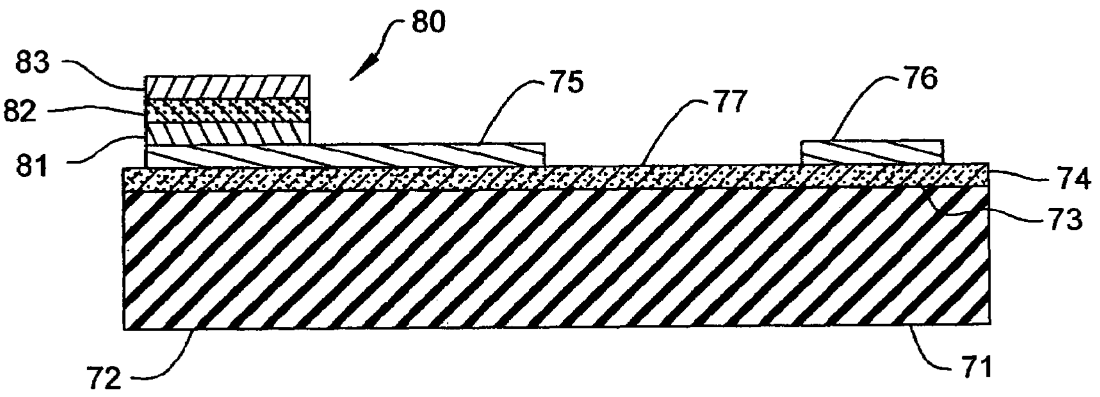

Next, a mask 97 is disposed over selected sections of the exposed copper foil 91 in as seen FIG. 9I. Specifically, the sections of the copper foil 91 that are to function as conductors 75 and 76 are masked. Mask 97 is also applied over the exposed surface of the capacitor outer electrode 83. As depicted by FIG. 9J, the exposed portions of the copper foil 91 are then etched away to resistive layer 74 and mask 97 is stripped from the workpiece. These etching and stripping steps, as seen in FIG. 9J, define out of the copper foil conductors 75 and 76 the portion of resistive layer 74 that defines resistor 77.

The material forming resistor 77 is then laser trimmed to accurately establish the resistance of the resistor. Conductive trace 84 is applied over conductive trace 76 to function as a ball pad that has the same approximate height relative to the substrate bottom surface 73 as the capacitor 80. Clearcoat 20 is then applied. Solder balls 17 are then attached to the capacitor outer electrode 83 and conductive trace 84. Since the steps of laser trimming the resistor 75, forming the conductive trace 84, forming the clearcoat 20 and attaching the solder balls are similar, if not identical, to those described with respect to the previously described embodiments of the invention, they are neither further illustrated nor described.

The above embodiment of the invention thus provides a relatively economic means to provide on a common surface of a relatively inexpensive non-conductive substrate an R-C network. There is no need to provide vias through the substrate in order to connect the different components forming the network. Moreover, in addition to providing one surface of the substrate with an R-C network, this invention provides a means to, on the same surface, also provide the conductive members that can be used to connect the network to an external component such as to a printed circuit board.

Still another feature of this version of the invention is that the electrode layer 94, the tantalum layer 92, the copper foil 91 and underlying resistive material 74 are selectively etched away. This exposes the underlying non-conductive substrate 71. A benefit of this feature of this embodiment of the invention is that it makes it possible to form separate, electrically isolated R-C networks on the same surface of the substrate 71.

Moreover, by providing tantalum capacitor dielectric layers, capacitance densities of at least 2000 pf/mm$^2$ can be achieved on substrates with low loss and low temperature coefficients.

Figure 10A:
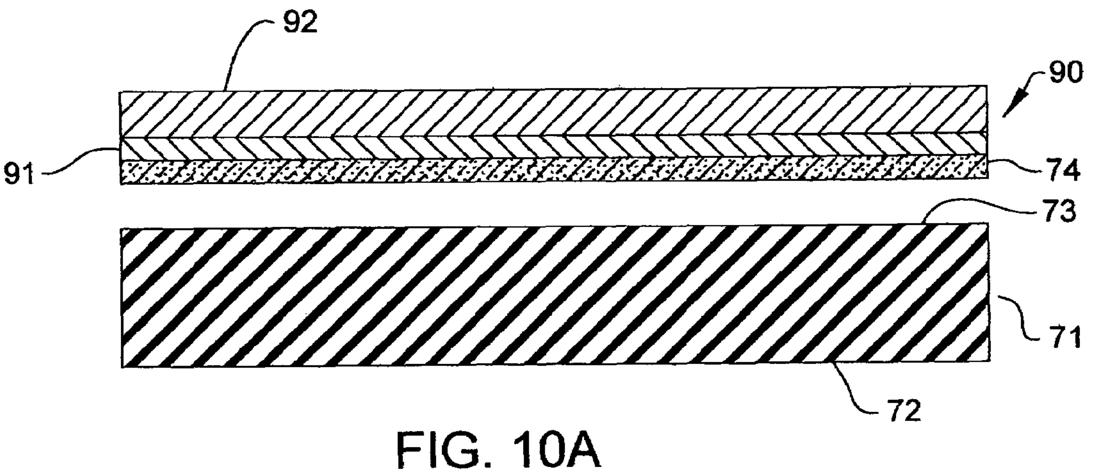
FIGS. 10A, 10B, 10C, 10D, 10E, 10F, 10G, 10H, 10I, 10J, 10K and 10L collectively illustrate the fabrication of an R-C network having the same structural features as the R-C network of FIG. 8.
Figure 10B:
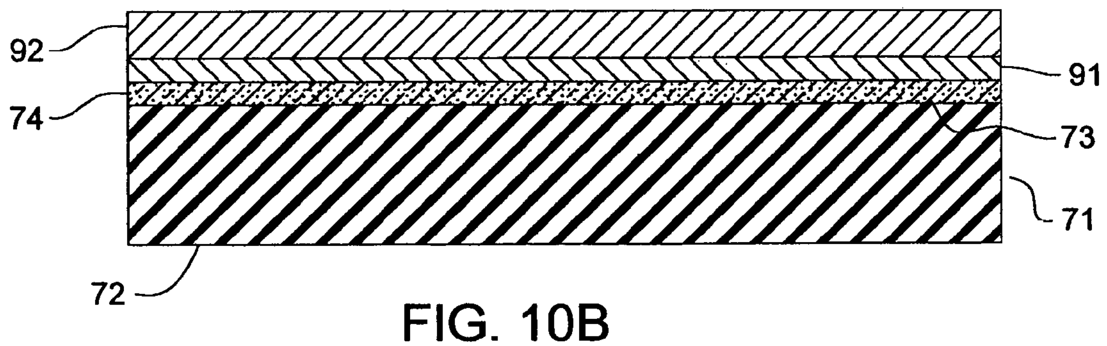

FIGS. 10A through 10L collectively illustrate an alternative process for manufacturing an R-C network having the same structure as the above-described assembly. Initially, as represented by FIGS. 10A and 10B, a R-C foil 90 is laminated to the bottom surface 72. These steps are identical to those described with respect to FIGS. 9A and 9B. Therefore, the description of these steps is not repeated.

Figure 10C:
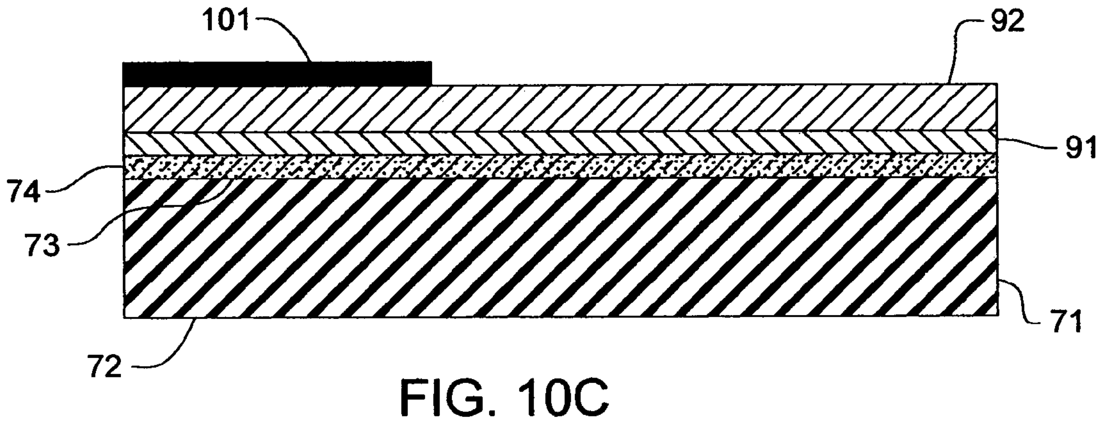
Figure 10D:
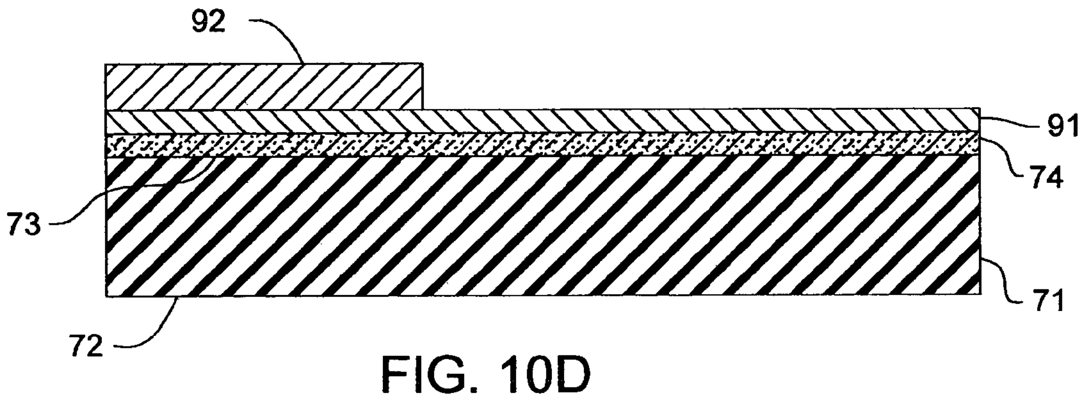
Figure 10E:
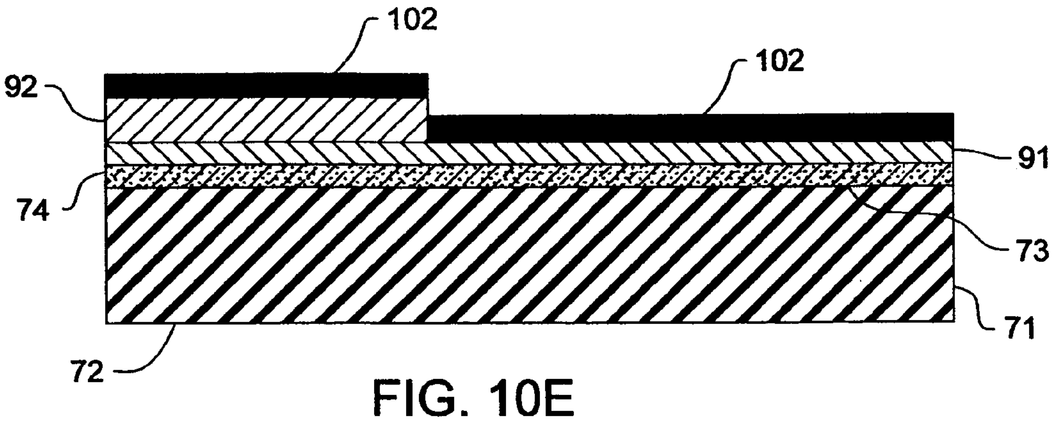

Then, the section of the tantalum layer 92 that is used to form the network capacitor is defined. Specifically, a mask 101 is formed over the exposed surface of the tantalum layer 92 that defines the section of the tantalum that will define the capacitor as seen by FIG. 10C. Next, as illustrated in FIG. 10D, the exposed section of the tantalum layer 92 is etched away and the mask 101 stripped away from the workpiece. A solution of 8% HF and 0.5% $HNO_3$ is used to etch the unneeded tantalum away from the workpiece. This material is typically etched away at a rate of 800 A/min.

It should be understood that, as part of this etching process, the sections of the tantalum layer 92 on either side of the capacitor-forming tantalum are also etched away.

Figure 10F:
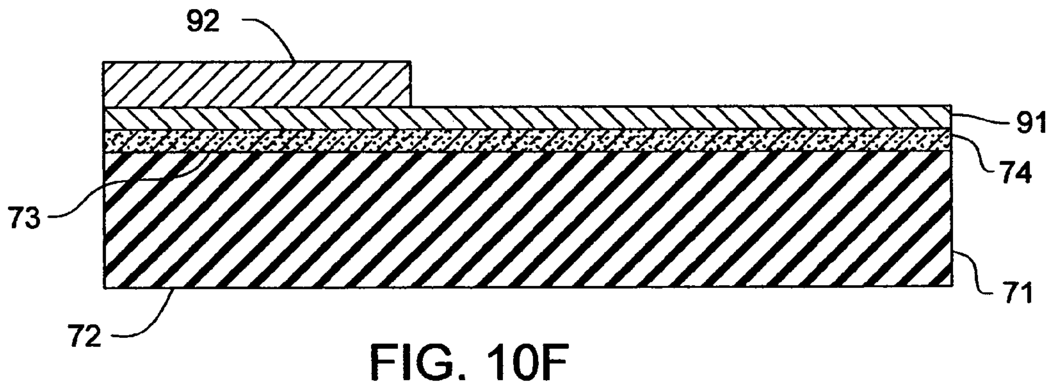

The copper foil 91 and underlying resistive material 74 not needed to form part of the R-C network are then removed. This is represented first by FIG. 10E wherein a mask 102 is selectively etched over the workpiece to cover both the copper foil 91 and the tantalum sections that are needed to form the components of the network. The exposed sections of the copper foil 91 and the underlying resistive material 74 are then etched away to expose the substrate bottom surface 73. This etching is performed with a solution consisting of 90 g/l $KMnO_4$+5 g/l HCl at 48° C. Mask 102 is then stripped away as depicted by FIG. 10F. At this stage, what remains on the substrate 71 are one or more sections of the copper foil 91 with the underlying resistive material 74 and one or more unanodized sections of tantalum 92.

Figure 10G:
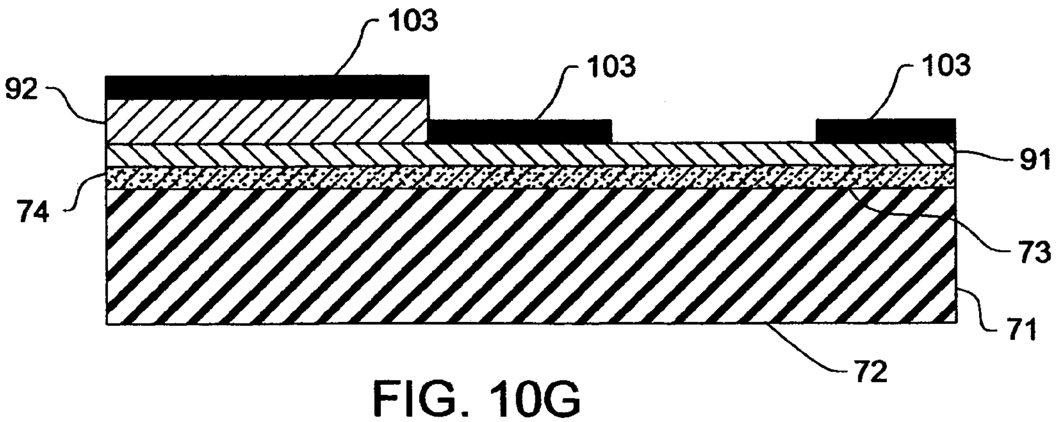
Figure 10H:
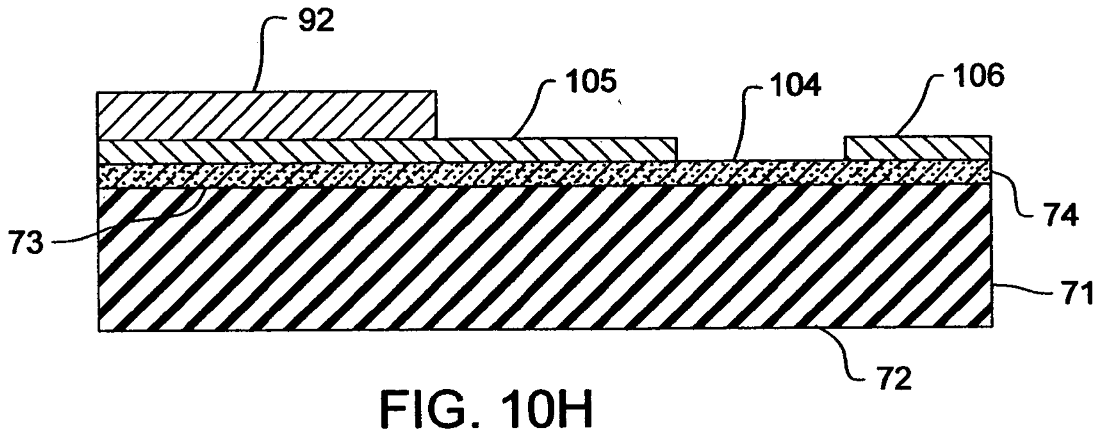

One or more of the remaining sections of the copper foil 91 are then selectively removed to define the conductors and resistors of the network. Specifically, as seen by FIG. 10G, a mask 103 is selectively applied over sections of the copper foil that are to define conductors and the remaining tantalum 92. The exposed copper foil 91 is etched to expose the underlying resistive material 74 and the mask 103 is stripped from the workpiece. As seen in FIG. 10H, these processes leave the workpiece with a resistor 104 formed from the exposed section of resistive material 74 and conductors 105 and 106 that are connected to the resistor.

Figure 10I:
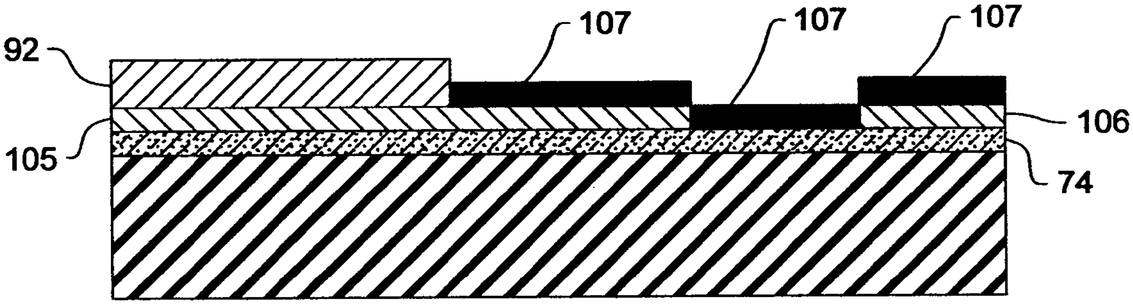
Figure 10J:
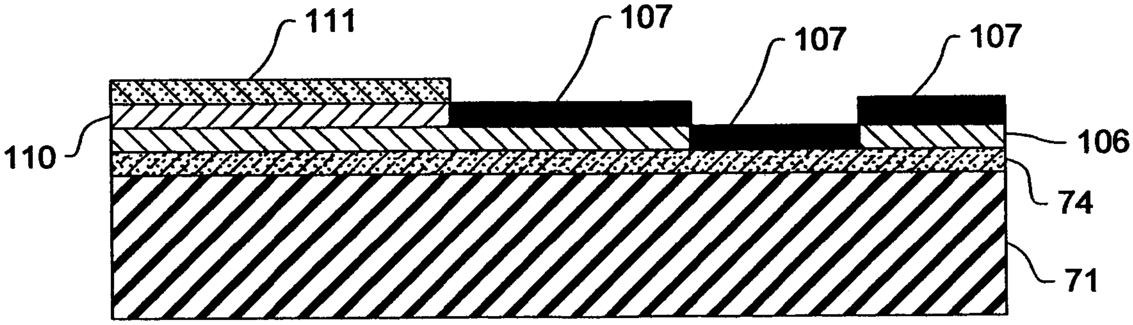

The dielectric layer of the capacitor is formed by anodizing the outer surface of the remaining tantalum 92. This process includes the layering of a mask 107 over the exposed surfaces of resistor 104 and conductive traces 105 and 106 as seen in FIG. 10I. The outer surface of the tantalum is then anodized. The anodization is performed with a solution consisting of 50% by volume Tetraglyme and 2% by volume $H_3PO_4$ at 40° C. This anodization may take up to three hours to perform. As depicted by FIG. 10J, once this process is complete, the inner, unanodized layer of tantalum is now available to function as capacitor electrode 110; the anodized outer layer is available to function as the capacitor dielectric layer 111.

Figure 10K:
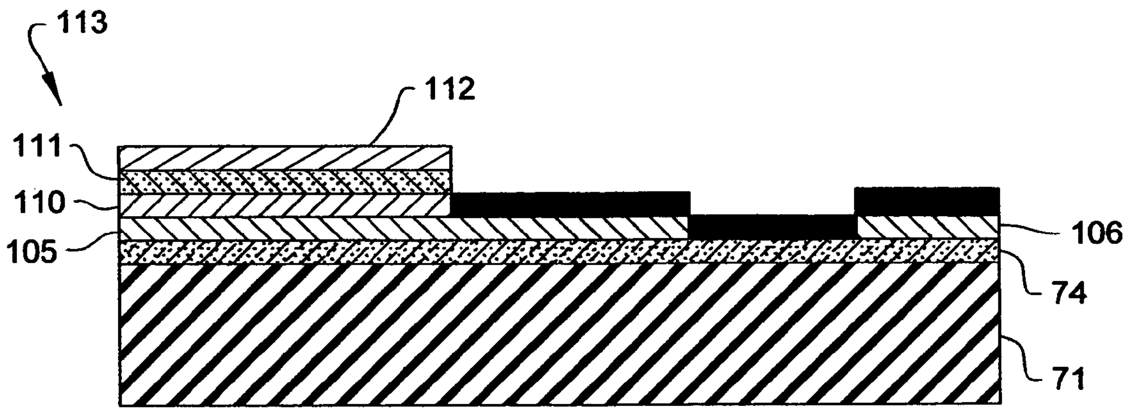

As depicted by FIG. 10K, an outer electrode 112 is then plated or otherwise formed over the exposed face of the capacitor dielectric layer 111. Outer electrode 112 may be formed by coating first a electroless nickel and then electrolytic copper over the capacitor dielectric layer 111. (Substeps not shown.) In this step, the previously applied mask 107 may again be employed to ensure the correct application of the material forming electrode 112. Collectively, the unanodized tantalum 92, the capacitor dielectric layer 111 and outer electrode 112 form a capacitor 113 of the R-C network.

Figure 10L:
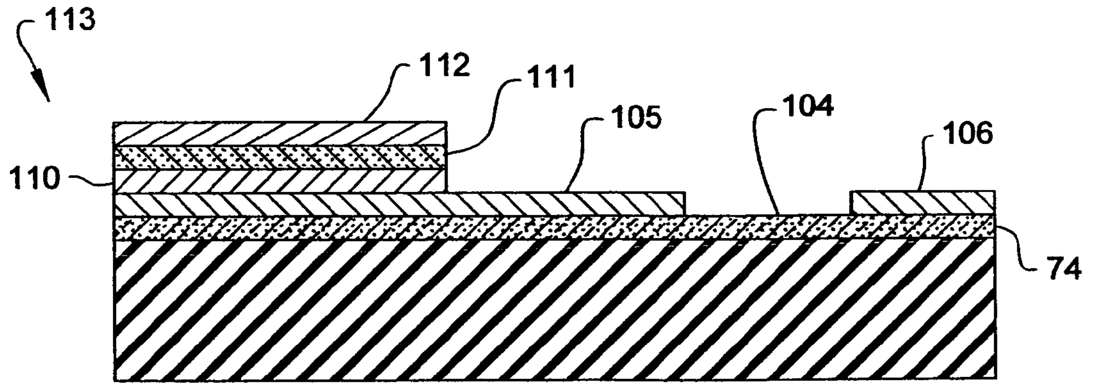

Mask 107 is then stripped from the workpiece as represented by FIG. 10L. Resistor 104 is laser trimmed, a conductive trace 84 applied to conductor 106 to function as a ball pad, a clearcoat 20 applied over the workpiece and solder balls 17 attached to complete the assembly of a terminator (steps not illustrated).

Variations of the Preferred Embodiments

While the above description and illustrations collectively describe three preferred embodiments of the invention, and four processes for fabricating the invention, variations are certainly possible. For example, the metals from which the substrate 11 or 50, overlying metal foil 55 or the metal used to form the anodized layer of the R-C foil 90 may be formed may be different from what has described. Valve metals such as Titanium, Hafnium, Tantalum, Tungsten, Zirconium, Niobium and Antimony may be used to form either the substrate 11 with anodized capacitor dielectric layer 23 or as the metal foil 55 from which the capacitor dielectric layer 56 is formed.

The above valve metals, further including Aluminum, may also function as the anodizable top metal layer of the R-C foil 90. Also, in may be possible in some versions of the invention for a layer of anodizable metal to serve as the primary substrate for the R-C foil. In these versions of the invention, unanodized sections of the metal would serve as both electrodes for the network's capacitors and the conductors between the components forming the network.

Moreover, there is no requirement that, in all versions of the invention wherein the R-C foil 90 is selectively shaped and/or anodized to form the R-C array, that the substrate to which the foil 90 is mounted be nonconductive. For example, in some versions of this embodiment of the invention, the substrate may be a heat dissipating metal. In these versions of the invention, it is anticipated a thermally conductive assembly dielectric layer will be disposed between the outer surface of the substrate and the R-C foil 90. This assembly dielectric layer may be formed from the material from which assembly dielectric layer 18 of the first described embodiment of the invention is formed.

In versions of the embodiment of the invention wherein the R-C foil 90 is disposed over an assembly dielectric layer, the layers of material forming the foil may all be removed so as to, at certain locations, expose the assembly dielectric layer. This would make it possible to, on a single substrate formed of heat dissipating metal, provide a plurality of electrically isolated R-C arrays. Alternatively, for some circuits it may be desirable to remove portions of the assembly dielectric layer. Conductive traces leading to the underlying metal substrate may then be provided. In these versions of the invention, the substrate, in addition to functioning as a heat dissipating component, also would function as a common bus conductor between different elements of the R-C array.

Further, it is anticipated some suppliers may provide an R-C foil that collectively consists of: a layer of resistive material; a metal substrate (optional); a layer of anodizable metal; and an outer electrode layer. If this type of foil is available, it would be applied to a substrate. The layers of material would be selectively removed and the anodizable metal selectively anodized. A feature of this version of the invention is that the process step needed to form the plating that subsequently defines the capacitor outer electrode would be eliminated. A vendor could similarly provide a version of the invention in which a sub layer of the anodizable metal is already anodized. This would eliminate the need to perform this anodization step during the fabrication of the R-C network. Similarly, in these versions of the invention, the R-C foil could be constructed so that the whole of the valve metal layer is anodized throughout its thickness. In these versions of the invention, an underlying layer of unanodizablemetal would, in addition to serving as the basic substrate for the R-C foil function as electrodes for the capacitors and the electrodes between the network components.

Also, in some versions of the invention, it may be desirable to provide a resistor only network. In these versions of the invention, the capacitors are not present.

Moreover, in the described and illustrated preferred embodiments of the inventions, all the components through which the signal flows are shown as being fabricated on one major surface, the bottom surface 13, 52 or 73 of the substrate 11, 50 or 71, respectively. It should be recognized that this is exemplary and not limiting. In alternative versions of the invention, it may be desirable to mount components on both major surfaces of the substrate. In order to make such connections possible, it is necessary to provide conductive paths between the opposed surfaces of the substrate that are electrically insulated from the metal-formed substrate 11 or 50. Thus, it may be necessary to provide conductive traces around the edges of substrate 11 or 50 that are separated from the substrate by dielectric layers. Alternatively, conductive cores contained within dielectric sleeves may extend through the substrate.

In a like variation, it should be recognized that the R-C network of this invention may not just be fabricated as a stand-alone component such as a terminator. The R-C network could, for example be fabricated on a substrate that serves as a layer of printed circuit board. Once the resistors and capacitors of the network are formed, a dielectric material is coated over these components and an additional substrate layer or layers are disposed over the components. Vias are formed that extend to the conductors of the R-C network. These vias connect the R-C network to other conductors disposed on or within the printed circuit board. Some of the conductors may terminate at contact points where components external to both the R-C network and the printed circuit board are mounted to the circuit board and connected to the R-C network. Thus, this embodiment of the invention would provide a circuit board with a built-in R-C network. An advantage of this construction is that the need to dedicate surface area on outside of the circuit board for providing the network is eliminated.

Similarly, there is no requirement that, in all versions of the invention solder balls be employed as the conductive projections that mechanically and electrically connect the R-C network to the external component to which it is mounted. In some versions of the invention, conductive bumps formed of solder paste reflowed into hump or bump shape may be deposited on the exposed faces of conductors 16 to function as the connecting elements. Conductive leads may also be provided as the connectors to the components integral with the R-C network.

Further, the steps of assembly the R-C array of this invention may be different from what has been described. For example, other means than electroplating may be used to form the resistors 14. Thus, the resistors could be formed by using either thin-film or thick-film coating techniques. In one such technique, a thin film of nickel chromium or nickel chromium silicide is vacuum deposited on the substrate. The resistors can also be formed by applying a doped platinum using a chemical vapor deposition process. A resistor paste that is selectively screen printed onto the substrate may alternatively be used to form the resistors 14. The resistor paste may also be applied to the surface of substrate 71 to later define resistor 77 or 104.

Prior to the laser trimming of the resistors 14, 77 and 104, a laser reflective layer may be applied to the partially assembled unit. This layer protects the underlying components of the assembly from any damage that could otherwise inadvertently occur as a result of the laser trimming. Once the laser trimming has occurred, the laser reflective layer is then removed.

Furthermore, in versions of the invention wherein metal foil 55 is used to form the capacitor electrodes and the anodized layer that functions as the capacitor dielectric layer, the removal of the foil after its application may be more significant than what has been described an illustrated. In these versions of the invention, after the metal foil is first applied to the whole of the substrate, significant portions of the foil may be removed to form a number of metal islands. Then, selected sections of the islands that are to function as the capacitor dielectric layers are anodized. It may even be desirable in these versions of the invention to leave only islands that collectively function as one of the capacitor's electrodes and the complementary capacitor dielectric layer. Alternatively, in these versions of the invention, unanodized islands of the metal foil may function as conductors between the components formed on the substrate. In these versions of the invention, some of the metal islands may only serve as conductors and not even have any anodized sections.

Figure 11:
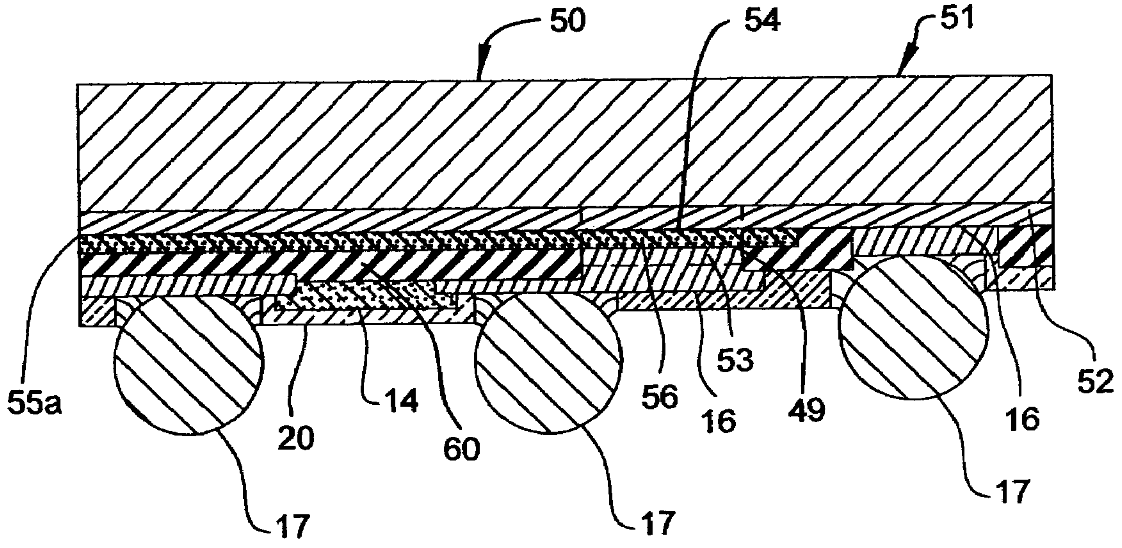
FIG. 11 is a cross-sectional view of a fourth alternative R-C network constructed in accordance with this invention.

Similarly, in alternative variations of the preferred embodiments of the invention, less metal foil may be removed than what has been described. For example, it may be desirable in some versions of the invention to not remove any of the metal foil covering the adjacent surface of the substrate. This particular version of the invention is illustrated in FIG. 11. This version of the invention is based on the version of the invention illustrated in FIG. 6. However, in this version of the invention, foil layer 55*a* covers the whole of the bottom surface 52 of the substrate 50. Thus, in this version of the invention, at least one of the conductors 16, here the rightmost conductor 16, is directly connected to the foil layer 55*a*. While not shown, in these versions of the invention, only the islands of metal foil that are to function as the capacitor dielectric layers may be anodized. Thus in these versions of the invention, the assembly dielectric layer 60 may be applied directly to the conductive layer of foil 55*a* in order to prevent electrical contact with surrounding components.

Moreover, there is no requirement that, in all versions of the invention wherein foil 55 is employed, the substrate be formed from conductive metal. In some versions of the invention, non-conductive material such as the material used to form substrate 71 may be employed as the primary substrate. In these versions of the invention, the metal foil is deposited over one surface of the substrate. The foil is selectively removed to form islands. Sections of the islands are selectively anodized. Thus, in these versions of the invention, the unanodized portions of the metal functions as the conductors and or the capacitor electrodes closest to the substrate. The overlying sections of anodized metal function as the capacitor dielectric layers. Once the foil is applied and the anodization complete, additional conductive material and dielectric material is applied over the same surface of the substrate to complete the assembly of the capacitors and to electrically separate the components from each other. Material forming the resistors is also applied to complete the desired R-C network. Then, solder balls or solder paste is applied to exposed portions of the conductors in order to provide the mechanical-electrical connectors for the terminator.

In versions of the invention with a nonmetallic substrate, a metal substrate may be bonded to the surface of the nonmetallic substrate opposite the surface on which the R-C network is formed. This metal substrate serves as a heat sink for the heat generated by the network resistors.

Thus, the above assembly provides an R-C network wherein all the components through which current flows, are located on a single major surface, the bottom surface, of the substrate. Thus, this design provides an R-C network with a non-metallic substrate that does not require vias that extend through the substrate in order to connect components on opposed surfaces of the substrate together.

Also, in constructing versions of the invention in which a metal member is used to function as an electrode and dielectric layer of the capacitor, this metal may be applied in forms other than as a strip of foil. For example, the metal may be plated on the underlying substrate. The outer layer of this metal is then selectively anodized so that this metal functions as the metal member that collectively serves as the capacitor electrode and capacitor dielectric. Moreover, the metal member may be selectively applied to the substrate surface. This would eliminate the later step of having to remove sections of the metal that are not required as either parts of the capacitors or inter-component conductors.

Similarly, the sequence by which the overlying metal is formed into to the capacitor dielectric layer may vary from what has been described. Thus, after the metal layer is applied to the substrate, the portions of the metal that are to function as the capacitor dielectric layers may be selectively anodized. Then, once the capacitor dielectric layers are formed, the sections of the metal that are not need are selectively removed.

Moreover, the application of the ball grid array R-C network of this invention is recognized to exemplary and not limiting. While the invention was directed to an R-C termination network, it is contemplated that the invention could be directed to other applications. For example the ball grid array R-C network could be used as part of a fuse array or used as a filter array. In these and other applications, it may be necessary to combine the R-C network of this invention with other components.

While the foregoing details what is felt to be the preferred embodiments of the invention, no material limitations to the scope of the claimed invention are intended. Further, features and design alternatives that would be obvious to one of ordinary skill in the art upon a reading of the present disclosure are considered to be incorporated herein. The scope of the invention is set forth and particularly described in the claims hereinbelow.

We claim:

1. A resistor-capacitor network comprising:
- a metal substrate having a first surface;
- a dielectric layer disposed over at least a portion of the first surface;
- at least one capacitor disposed on the first surface, the capacitor including:
  - a) a first electrode;
  - b) a second electrode;
  - c) an anodized layer located between the first and second electrodes;
- a resistor formed from a layer of resistive material disposed over the dielectric layer;
- a conductor extending between the capacitor and the resistor that electrically connects the capacitor and the resistor; and
- at least one conductive projection coupled to the first surface that extends away from the first surface and is electrically coupled to the capacitor or the resistor for connecting the capacitor or the resistor to an external component.

2. The resistor-capacitor network of claim 1, wherein a metal layer is disposed at least partially over the first surface.

3. The resistor-capacitor network of claim 1, wherein the conductor and the first electrode are formed from an integral material.

4. The resistor-capacitor network of claim 1, wherein the at least one conductive projection is a conductive ball.

5. The resistor-capacitor network of claim 1, wherein a covercoat is disposed over the first surface.

6. The resistor-capacitor network of claim 2, wherein the metal layer is formed from a metal different from the substrate metal.

7. A resistor-capacitor network comprising:
- a metal substrate having at least a first major surface;
- a dielectric layer formed on at least a portion of the substrate first major surface;
- a resistor formed on the dielectric layer;
- a metal member coupled with the substrate first major surface, said metal member having a conductive inner layer that forms a first electrode of a capacitor and an anodized layer disposed over the conductive inner layer;

a conductor disposed over the substrate first major surface that extends from over said metal member outer layer to said resistor, the portion of said conductor disposed over said metal member outer layer forming a second electrode of said capacitor; and at least one conductive projection coupled to the substrate first major surface that extends away from the substrate first major surface and that is electrically coupled to said capacitor or said resistor for connecting said capacitor or said resistor to an external component.

8. The resistor-capacitor network of claim 7, wherein:

said substrate is formed from a first metal; and said metal member is formed from a second metal that is different from said first metal.

9. The resistor-capacitor network of claim 7, wherein said at least one conductive projection is a conductive ball.

10. The resistor-capacitor network of claim 7, wherein a covercoat is disposed over said substrate first major surface.

11. A resistor-capacitor network comprising:

metal substrate means having a first surface;

dielectric means for providing an insulated area, the dielectric means located on the first surface; capacitor means for storing a charge, the capacitor means located on the first surface, and including:

a) a first electrode;

b) a second electrode;

c) an anodized layer located between said first and second electrodes;

d) resistor means for generating a resistance, the resistor means located on the dielectric means; e) conductor means for conducting a voltage, the conductor means extending between said capacitor means and said resistor means; and f) at least one conductive projection coupled to the first surface that extends away from the first surface and is electrically coupled to the capacitor means or the resistor means for connecting the capacitor or the resistor to an external component.

12. The resistor-capacitor network of claim 11, wherein the connection means is a conductive ball.

* * * * *